United States Patent
Nishiwaki et al.

(10) Patent No.: US 7,824,825 B2
(45) Date of Patent: Nov. 2, 2010

(54) STENCIL MASKS, METHOD OF MANUFACTURING STENCIL MASKS, AND METHOD OF USING STENCIL MASKS

(75) Inventors: Tsuyoshi Nishiwaki, Nisshin (JP); Hideki Tojima, Numazu (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 762 days.

(21) Appl. No.: 11/496,552

(22) Filed: Aug. 1, 2006

(65) Prior Publication Data

US 2007/0077501 A1    Apr. 5, 2007

(30) Foreign Application Priority Data

Aug. 3, 2005  (JP) ............................. 2005-225453

(51) Int. Cl.
    G03F 1/00    (2006.01)
    G03F 7/20    (2006.01)
    G21K 5/04    (2006.01)
(52) U.S. Cl. .................... 430/5; 430/296; 250/492.2
(58) Field of Classification Search ............... 430/5, 430/22, 296; 250/492.1, 492.2, 492.22
    See application file for complete search history.

(56) References Cited

U.S. PATENT DOCUMENTS

| | | | |
|---|---|---|---|
| 4,661,203 A * | 4/1987 | Smith et al. ................ | 438/725 |
| 5,569,569 A | 10/1996 | Goto | |
| 6,787,785 B2 | 9/2004 | Moriya et al. | |
| 6,825,482 B1 | 11/2004 | Oh et al. | |
| 6,916,582 B2 | 7/2005 | Yoshizawa | |
| 6,930,316 B2 | 8/2005 | Nishihashi et al. | |
| 7,057,300 B2 | 6/2006 | Moriya et al. | |
| 7,060,996 B2 | 6/2006 | Moriya et al. | |
| 7,144,178 B2 | 12/2006 | Moriya et al. | |
| 7,267,911 B2 | 9/2007 | Shibata | |
| 7,556,895 B2 | 7/2009 | Moriya et al. | |

(Continued)

FOREIGN PATENT DOCUMENTS

JP    10-270353    10/1998

(Continued)

OTHER PUBLICATIONS

German Office Action dated Jun. 27, 2008.

(Continued)

*Primary Examiner*—Stephen Rosasco
*Assistant Examiner*—Jonathan Jelsma
(74) *Attorney, Agent, or Firm*—Finnegan, Henderson, Farabow, Garrett & Dunner, LLP

(57) ABSTRACT

The present invention presents a stencil mask in which various surface patterns can be formed, and in which deformation is suppressed when charged particles are introduced. A stencil mask of the present invention is provided with a semiconductor stack. A first penetrating hole corresponding to an ion introducing area is formed in a first semiconductor layer of the semiconductor stack, and second penetrating holes are formed in a second semiconductor layer, these second penetrating holes having a width greater than the width of the first penetrating hole. The first penetrating hole and the second penetrating holes communicate and pass through the semiconductor stack. Beam members extending between adjacent second penetrating holes connect portions of the first semiconductor layer separated by the first penetrating hole.

10 Claims, 27 Drawing Sheets

U.S. PATENT DOCUMENTS

| | | | |
|---|---|---|---|
| 2002/0130425 A1* | 9/2002 | Koike et al. | 257/797 |
| 2003/0137024 A1 | 7/2003 | Moriya et al. | |
| 2004/0219444 A1 | 11/2004 | Shibata et al. | |
| 2004/0265744 A1* | 12/2004 | Kim et al. | 430/296 |

FOREIGN PATENT DOCUMENTS

| | | |
|---|---|---|
| JP | 2002-50565 | 2/2002 |
| JP | 2002-280290 | 9/2002 |
| JP | 2003-37055 | 2/2003 |
| JP | 2003-59819 | 2/2003 |
| JP | 2003-100583 | 4/2003 |
| JP | 2003-208869 | 7/2003 |
| JP | 2004-158681 | 6/2004 |
| JP | 2004-207570 | 7/2004 |
| JP | 2004-297027 | 10/2004 |

OTHER PUBLICATIONS

Notification of Reasons for Rejection for JP Appl. No. 2005-225453 dated Aug. 3, 2010.

* cited by examiner

PRIOR ART

Distance Dg between the First Semiconductor Layer and the Semiconductor Substrate [μm]

Scattering Angle σ of the Beam [deg]

PRIOR ART

STENCIL MASKS, METHOD OF MANUFACTURING STENCIL MASKS, AND METHOD OF USING STENCIL MASKS

CROSS-REFERENCE TO RELATED APPLICATION

The present application claims priority based on Japanese Patent Application No. 2005-225453, filed on Aug. 3, 2005, the contents of which are hereby incorporated by reference within this application.

BACKGROUND OF THE INVENTION

1. Field of the Invention

The present invention relates to a stencil mask for limiting an irradiation area of charged particles on a surface of a substrate to a predetermined shape. The charged particles may be ionized atoms, electrons, etc. The stencil mask is suitable for manufacturing a semiconductor device that works as a switching element, light emitting element, light detecting element. The stencil mask is also suitable for manufacturing a micromachine.

2. Description of the Related Art

In the process of manufacturing the semiconductor device, a process is widely used wherein a local area on a surface of a semiconductor substrate is irradiated with the charged particles, and an area apart from this local area is not irradiated with the charged particles. The local area where the charged particles are irradiated is termed an irradiation area in the present specification. The charged particles are introduced into a surface layer of the semiconductor substrate at the irradiation area. The introduced ionized atoms generally work as impurities.

A pattern of the area where the charged particles are introduced into the semiconductor substrate can be controlled by a masking film that prohibits penetration of the charged particles. Generally, the following method is performed for this type of process: a masking film is formed on the entire surface of the semiconductor substrate, penetrating holes are formed in the masking film, and the surface of the semiconductor substrate that is exposed from the masking film is irradiated with the charged particles. This method requires a step of forming the masking film on the surface of the semiconductor substrate, a step of forming the penetrating holes in the masking film, and a step of removing the masking film, etc. This method therefore has the problem that many steps are required for manufacturing the semiconductor device. Stencil masks have been developed in order to solve this problem.

Stencil mask is a masking member in which a penetrating hole has already been formed. In a method of utilizing a stencil mask, the stencil mask is disposed above the semiconductor substrate. The charged particles are irradiated toward the surface of the semiconductor substrate through the penetrating hole in the stencil mask. The stencil mask limits the irradiation area of the charged particles to be substantially equal to the pattern of the penetrating hole. The stencil mask can be used repeatedly for a plurality of semiconductor substrates. The method of utilizing the stencil mask does not require the step of forming the masking film on the surface of the semiconductor substrate, the step of forming the penetrating hole in the masking film, nor the step of removing the masking film. The method of utilizing the stencil mask can therefore considerably reduce the number of steps required for manufacturing the semiconductor device.

The stencil mask comprises a flat plate-shaped member in which the penetrating hole is formed. The penetrating hole has a shape that substantially corresponds to the irradiation area of the charged particles. The penetrating hole is usually formed by etching the flat plate-shaped member using the RIE (Reactive Ion Etching) method or the like. Since there are limits as to the value of the aspect ratio (the value when the depth of the penetrating hole is divided by the width of the penetrating hole) in the currently available etching processes, a thin flat plate-shaped member must be used for forming the penetrating hole whose width is narrow, or for forming a pair of penetrating holes which are separated with a thin wall.

Various types of patterns of the irradiation area are required to be formed on the surface of the semiconductor substrate. Therefore, the penetrating hole or holes of the stencil mask must also be formed in various shapes. As a result, the problem can arise that forming the penetrating hole or holes causes deformation of the plate-shaped member to easily occur near side walls defining the penetrating hole or holes. Techniques for preventing the deformation of the plate-shaped member are required.

Further, there is a case that the pattern of the irradiation area has a looping shape. In this case, the penetrating hole must also have the looping shape. However, when the penetrating hole is in the looping shape, the part of the flat plate-shaped member surrounded by the looping hole becomes separated from the part of the flat plate-shaped member surrounding the penetrating hole. Techniques for preventing this separation are also required.

In order to deal with these problems, a technique was taught in Japanese Patent Application Publication No. 2002-280290, in which beam members are formed within the penetrating hole of the stencil mask. The beam members pass across the penetrating hole, thus connecting one part of the flat plate-shaped member, which had been divided by the penetrating hole, with the other part of the flat plate-shaped member. The beam members strengthen the stencil mask near the side walls defining the penetrating hole, and can prevent the deformation of this part. Further, in the case where the penetrating hole has a looping shape, the beam members connect the part of the flat plate-shaped member surrounded by the looping hole and the part of the flat plate-shaped member surrounding the penetrating hole, thus preventing the inner side of the flat plate-shaped member (island portion) separated from the outer side of the flat plate-shaped member.

BRIEF SUMMARY OF THE INVENTION

If beam members are formed using the technique taught in Japanese Patent Application Publication No. 2002-280290, deformation of the stencil mask can be suppressed even when various patterns of the penetrating hole or holes are formed. However, when the charged particles were introduced with this type of the stencil mask, a part of the irradiation area was masked by the beam member, and the density of the charged particles becomes uneven within the irradiation area. If the distance between the stencil mask and the semiconductor substrate is increased, a scattering phenomenon of the charged particles may be used to essentially eliminate this shadowing effect by the beam member. However, in this case, the scattering phenomenon causes the charged particles to be introduced over a wide area, and it is no longer possible to accurately control the irradiation area to the predetermined pattern at the surface of the semiconductor substrate. With semiconductor devices, it is often desirable that the density of the charged particles has a uniform distribution over the irradiation area. It is often also desirable that a very small pattern of the irradiation area is formed at the surface of the semiconductor substrate. In this case, the conventional stencil mask cannot be utilized.

Furthermore, when this type of stencil mask having beam members was utilized and the charged particles were introduced, the temperature of the stencil mask is increased because the charged particles collide with the stencil mask, and as a result, deformation of the stencil mask frequently occurred. Deformation of the stencil mask causes the problems that the irradiation area of the charged particles would shift, or that the dimensional accuracy of the irradiation area would be worsened.

If a very small pattern of the irradiation area is desired, a very thin stencil mask must be used due to the limitation as to the aspect ratio of etching the penetrating hole. However, collision of the charged particles causes the temperature of the thin stencil mask to increase greatly, and consequently there is an increase in the amount of deformation. Further, a thin stencil mask has weak mechanical rigidity and therefore, in order to suppress the deformation, the width of each of the beam members must be increased. When the width of the beam member is increased, the density of the charged particles within the irradiation area readily becomes uneven. With the conventional stencil mask, it is not possible to form a very small irradiation area while adjusting the density of the charged particles to have a uniform distribution.

The present invention teaches a stencil mask for limiting an irradiation area of charged particles on a surface of a substrate to a predetermined shape. The stencil mask of the present invention comprises a first layer disposed at a side of the stencil mask facing the substrate to which the charged particles are introduced, and a second layer disposed at a side of the stencil mask to which the charged particles are irradiated. At least one first penetrating hole having a shape corresponding to the intended irradiation area is formed in the first layer. A plurality of second penetrating holes is formed in the second layer within an area encompassing the intended irradiation area. The plurality of the second penetrating holes is widely distributed within the area.

In the stencil mask of the present invention, when viewed along the traveling path of the charged particles, a portion between adjacent the second penetrating holes of the second layer cross across the first penetrating hole of the first layer. Two portions of the first layer separated by the first penetrating hole are connected by the portion of the second layer separating the adjacent second penetrating holes. Two portions of the first layer separated by the first penetrating hole are connected at a height different from the first layer.

The substrate to which the charged particles are irradiated is typically a semiconductor substrate. However, the stencil mask of the present invention can also be utilized for irradiating the charged particles into a material other than a semiconductor substrate.

The irradiation area means a portion of the surface of the substrate where the charged particles are irradiated. The term irradiation area usually means a pattern in which the charged particles are introduced. The charged particles that have been irradiated to the substrate surface are usually introduced into the surface layer of the substrate. However, the charged particles may pass through the substrate. Therefore the irradiation area is not necessarily equal to the pattern where the charged particles stay. Furthermore, the charged particles that have been irradiated to the substrate surface may penetrate the substance for a certain distance and stay at the certain depth. The pattern where the charged particles stay at the depth is not necessarily equal to the irradiation area at the surface of the substrate, because the charged particle scatter while penetrating the distance. The irradiation area is not necessarily equal to the area where the charged particles stay. The first penetrating hole formed in the first layer of the stencil mask has a shape substantially corresponding to the irradiation area which is not necessarily equal to the pattern where the charged particles stay.

The stencil mask of the present invention may comprise other layers than the first layer and the second layer. The first layer and the second layer may be formed integrally. Alternatively, the first layer and the second layer may be formed separately.

The first penetrating hole is formed in the first layer of the stencil mask in a shape substantially corresponding to the predetermined shape of the irradiation area. However, the shape of the first penetrating hole is not restricted to being entirely identical with the irradiation area. The shape of the first penetrating hole may be designed taking into account a spread of the charged particles caused by the scattering phenomenon of the charged particles that have passed through the first penetrating hole. Further, the charged particles may be irradiated onto the surface of the substrate by passing through the first penetrating hole from an oblique direction. The shape of the first penetrating hole may be designed taking into account this type of method of use. In this type of case, the shape of the first penetrating hole is not strictly identical with the shape of the area where the charged particles are irradiated. The shape of the first penetrating hole is designed so that, after various phenomenons have proceeded, the charged particles can be irradiated to the intended irradiation area on the substrate surface. In the present specification, this is referred to as 'the shape of the first penetrating hole corresponds to the predetermined shape of the irradiation area.'

The plurality of the second penetrating holes is formed in the second layer. The charged particles that are being irradiated are led to the first penetrating hole after passing through the second penetrating holes. The plurality of second penetrating holes is distributed and forms a distributing area. The distribution area may be the same shape as of the first penetrating hole, however, it is preferred that the distribution area is slightly larger than the first penetrating hole and encompasses the first penetrating hole. The distribution area may be much larger that the first penetrating hole, and second penetrating holes may be distributed over the entire area of the second layer. There are portions present between adjacent second penetrating holes in the distributing area. In the stencil mask of the present invention, these portions extending between adjacent second penetrating holes allow the first penetrating hole to have a variety of shapes. That is, when viewed along the traveling path of the charged particles, the portions extending between adjacent second penetrating holes and separating adjacent second holes pass across the first penetrating hole. As a result, the portions between adjacent second penetrating holes can increase mechanical rigidity near side walls of the first layer, these side walls defining the first penetrating hole. The portions between the second penetrating holes allow a stencil mask to be configured in which deformation does not readily occur.

Furthermore, the stencil mask of the present invention can effectively utilize the scattering phenomenon of the charged particles. Since the charged particles are electrically charged, there is repulsive force operating between each of the charged particles. The charged particles consequently scatter while proceeding along their traveling path.

In the stencil mask of the present invention, a plurality of second penetrating holes is formed in the second layer, and the portions extending between adjacent second penetrating holes pass above the first penetrating hole. The charged particles that have passed through the plurality of second penetrating holes scatter within the first penetrating hole while passing through the first penetrating hole. The charged particles are therefore able to proceed, within the first penetrating hole, toward a space below the portion of the second layer separating adjacent second penetrating holes. The charged particles that have passed through the second penetrating holes and the first penetrating hole can therefore be irradiated in the pattern that crossly corresponds to the shape of the first penetrating hole. The irradiation pattern of the charged particles that have passed through the second penetrating holes and the first penetrating hole is hardly affected by the shadowing effect created by the portion separating adjacent second penetrating holes.

With the stencil mask of the present invention, even though the portion separating adjacent second penetrating holes is present, it is possible to eliminate the shadowing effect by that portion. In order to eliminate the shadowing effect by the scattering phenomenon of the charged particles, a certain distance is required between the stencil mask and the surface of the substrate. In the conventional stencil mask, a long distance is required between the stencil mask and the surface in order to eliminate the shadowing effect. In the present stencil mask, the distance between the stencil mask and the substrate can be decreased because the charged particles are scattered while passing through the first penetrating hole. The thickness of the first layer may be used to promote the scattering.

When the distance between the stencil mask and the substrate is decreased, the charged particles that have passed through the second penetrating holes and the first penetrating hole do not spread over a wide area, and can be irradiated on the surface of the substrate in a shape that closely reflects the shape of the first penetrating hole. When the stencil mask of the present invention is utilized, the charged particles can be irradiated within the irradiation area that is very similar to the shape of the first penetrating hole.

Further, there are no problems in increasing thickness of the second layer of the present invention. When the second layer is thick, the thick second layer gives strong mechanical rigidity to the first layer; therefore, the first layer can be made thinner. When the first layer is thinner, a very small first penetrating hole can be formed in the first layer even if the aspect ratio of the etching for forming the first penetrating hole is limited. In the stencil mask of the present invention, the first layer has the role of limiting the irradiation area, and the second layer has the role of increasing the mechanical rigidity of the stencil mask. Each of the first layer and the second layer has its own role. Consequently, even if the second layer is thick, it is possible to form a first penetrating hole with a desired shape in the first layer. Increasing the thickness of the second layer allows the mechanical rigidity of the stencil mask to be increased. Further, increasing the thickness of the second layer allows the heat capacity of the stencil mask to be increased. When the heat capacity of the stencil mask is increased, it is possible to suppress an excessive increase in the temperature of the stencil mask when the stencil mask is exposed to the charged particles. The stencil mask of the present invention is therefore able to suppress deformation caused by an increase in temperature.

With the stencil mask of the present invention, it is preferred that the distributing area of the second penetrating holes is larger than the shape of the first penetrating hole when viewed along the traveling path of the charged particles. The traveling path of the charged particles does not mean the directions in which the charged particles are caused to travel by the scattering phenomenon, but refers to a direction that links an irradiation source of the charged particles to the surface of the substrate.

With the aforementioned stencil mask, a large amount of charged particles can be guided into the first penetrating hole of the first layer through the second penetrating holes.

With the stencil mask of the present invention, it is preferred that the first layer and the second layer are made of semiconductor material. Further, it is preferred that the first layer and the second layer are in contact with each other.

A stencil mask that utilizes a stack of semiconductors can therefore be manufactured easily.

The stencil mask of the present invention is particularly useful in the case where the first penetrating hole is shaped as a closed loop, and an island portion is included within the closed loop. Even though the first penetrating hole forms the loop, the portions separating the second penetrating holes can connect the island portion surrounded by the closed loop and the part of the first layer outside the closed loop. With the stencil mask of the present invention, therefore, it is possible to prevent the island portion inside the first penetrating hole from separating from the part of the first layer outside the first penetrating hole.

Since the stencil mask of the present invention can utilize the scattering phenomenon of the charged particles, it is possible for the charged particles to arrive at the surface of the substrate positioned below the portions separating adjacent second penetrating holes. When the stencil mask of the present invention is utilized, a looped irradiation area can be formed by performing the irradiation of the charged particles a single time.

With the stencil mask of the present invention, it is preferred that each of the second penetrating holes has a convex polygonal shape.

In the present invention, each of the second penetrating holes is formed into a convex polygonal shape by adjusting the shape and positional relationship of the portion separating the adjacent second penetrating holes. When the second penetrating hole has a convex polygonal shape, there are no longer positions where stress readily accumulates near the side walls of the second layer that demarcate the second penetrating hole, and deformation of the second layer is therefore prevented extremely well.

With the stencil mask of the present invention, it is preferred that distance between adjacent second holes is long at the side of the second layer to which the charged particles are irradiated, and short at the side of the second layer facing towards the first layer. In other words, with the stencil mask of the present invention, it is preferred that the width of the portion separating adjacent second penetrating holes becomes shorter along the traveling path of the charged particles. The above feature is obtained when side walls of the portion extending between adjacent second penetrating holes are inclined with respect to the traveling path of the charged particles.

With the aforementioned stencil mask, the portion between adjacent second penetrating holes has a longer width at the side away from the substrate, and has a shorter width at the side by the substrate. Since the portion between adjacent second penetrating holes has a longer width at the side away from the substrate, these portion is able to firmly join portions of the second layer that are separated by the second penetrating holes. Deformation near the side walls of the second penetrating holes can therefore be suppressed. Further, since the portion between adjacent second penetrating holes has a shorter width at the side by the substrate, a large amount of the charged particles that have passed through the second penetrating holes are able to arrive at the surface of the substrate at the area below the portion between the second penetrating holes. The effects on the masking pattern by the portions between the second penetrating holes are thus reduced.

A device for irradiating the charged particles adopting the stencil mask of the present invention is extremely useful. The device for irradiating the charged particles of the present invention comprises a charged particle generator, a mass analyzer for selecting predetermined charged particles from the charged particles generated by the generator, an accelerator for accelerating the selected charged particles, an irradiating chamber where a substrate is to be accepted, and the stencil mask of the present invention disposed between the accelerator and the substrate which is accepted within the irradiating chamber.

In conventional devices equipped with stencil masks, deformation of the stencil mask caused by an increase in temperature, etc. was a serious problem. The conventional devices for irradiating the charged particles were therefore utilized within a range in which the stencil mask did not deform, and consequently the devices for irradiating the charged particles could not work efficiently. In the stencil mask of the present invention, deformation of the stencil mask caused by an increase in temperature is suppressed. As a result, by providing the stencil mask of the present invention, an extremely efficient device for irradiating the charged particles can be realized.

It is preferred that the stencil mask of the present invention is disposed above the substrate, and that the charged particles are irradiated through the stencil mask toward the surface of the substrate.

When the stencil mask of the present invention is utilized, it is possible to form a variety of irradiation areas on the surface of the substrate. Furthermore, because it is possible to suppress an increase in temperature of the stencil mask, the output of the charged particles generator can be increased, and a large amount of charged particles can be irradiated to the surface of the substrate.

Further, when the stencil mask of the present invention is utilized, a useful semiconductor device can be obtained. That is, in a method of manufacturing the semiconductor device, the stencil mask of the present invention is disposed above a semiconductor wafer, and the charged particles are irradiated through the stencil mask to the surface of the semiconductor wafer. It is thus possible to form a variety of irradiation areas on the surface of the semiconductor wafer. Furthermore, because an increase in temperature of the stencil mask is suppressed, the output of the generator of the charged particles can be increased, and a large amount of charged particles can be irradiated to the semiconductor wafer. By using the manufacturing method of the present invention, it is possible to obtain a semiconductor device that has a variety of very small semiconductor regions.

The present invention also presents a method of manufacturing the stencil mask. The manufacturing method of the present invention comprises: forming a plurality of second penetrating holes distributed on a semiconductor lower layer; filling up the plurality of second penetrating holes with a sacrifice material; forming a semiconductor upper layer continuously on the surface of the semiconductor lower layer; forming a first penetrating hole in the semiconductor upper layer, the first penetrating hole communicating with the plurality of second penetrating holes and having a shape corresponding to the predetermined shape; and selectively removing the sacrifice material by using an etching material which etches the sacrifice material but does not etch the semiconductor lower layer and semiconductor upper layer.

With this manufacturing method, the second layer of the stencil mask is formed using the semiconductor lower layer, and the first layer of the stencil mask is formed using the semiconductor upper layer. The stencil mask of the present invention can thus be manufactured easily.

When the stencil mask of the present invention is utilized, deformation of the stencil mask is suppressed when the charged particles are irradiated. Furthermore, when the stencil mask of the present invention is utilized, a variety of very small irradiation area can be formed on the surface of the substrate. Further, with the method of manufacturing the semiconductor device of the present invention, it is possible to obtain a useful semiconductor device. Moreover, with the method of manufacturing the stencil mask of the present invention, it is possible to efficiently manufacture the stencil mask for the semiconductor device.

DETAILED DESCRIPTION OF THE INVENTION

Description of the Preferred Features

Figure 1:
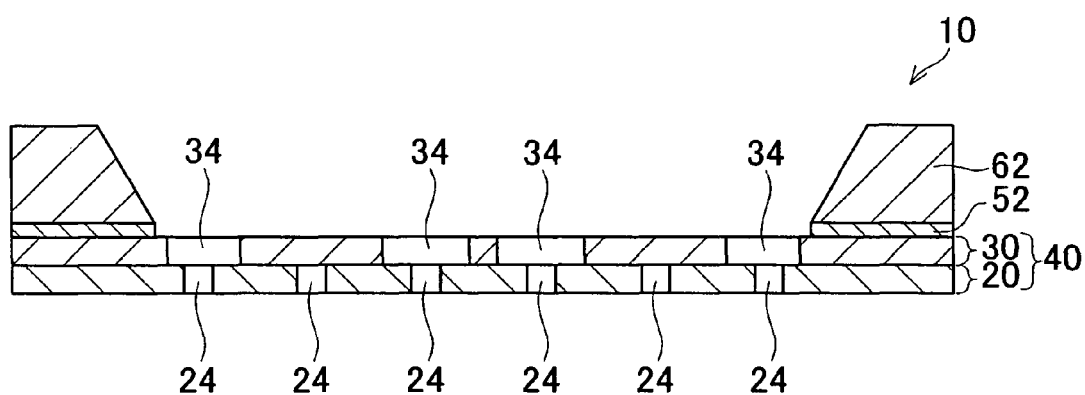
FIG. 1 schematically shows the basic configuration of a stencil mask.

The preferred features of the present invention will be described below.

(First Preferred Feature)

The stencil mask comprises a semiconductor stack in which a first semiconductor layer and a second semiconductor layer are stacked. The first semiconductor layer is disposed at a side of the stencil mask which faces toward a substrate, and the second semiconductor layer is disposed at a side of the stencil mask to which charged particles are irradiated. A first penetrating hole is formed in the first semiconductor layer in a shape corresponding to an area where the substrate surface is exposed to the charged particles. A plurality of second penetrating holes is formed in the second semiconductor layer, these second penetrating holes communicating with the first penetrating hole. The second penetrating holes are distributed, and the plurality of second penetrating holes forms a distributing area. The distributing area is wider than the first penetrating hole and encompasses the first penetrating hole. Beam members separating adjacent second penetrating holes extend above the first penetrating hole. The beam member connects portions of the first layer separated by the first penetrating hole.

The semiconductor stack may further have a supplementary semiconductor layer that is stacked on the second semiconductor layer. In this case, a large penetrating hole is formed in the supplementary semiconductor layer, and this penetrating hole communicate with the first penetrating hole and the second penetrating holes. Beam members may also be formed at the supplementary semiconductor layer.

(Second Preferred Feature)

The second semiconductor layer is separated by the distributing area of the second penetrating holes into an outer second semiconductor layer and an inner second semiconductor layer. The beam members that connect the outer second semiconductor layer and the inner second semiconductor layer pass across the distributing area of the second penetrating holes. The beam members are not formed within the first penetrating hole. As a result, the traveling path of the charged particles that have passed through adjacent second penetrating holes can join within the first penetrating hole. The thickness of the first penetrating hole can be adjusted to eliminate a shadow pattern caused by the beam member extending between adjacent second penetrating holes.

(Third Preferred Feature)

The width of the beam member separating adjacent second penetrating holes is wider at a non-substrate side, and is thinner at a substrate side.

When the beam member has a thinner width at the substrate side, the charged particles that have passed through adjacent second penetrating holes join while traveling the short distance after passing through the second penetrating holes. A large number the charged particles can arrive at the shadow area below the beam member, even if the first layer is thin.

(Fourth Preferred Feature)

The beam members separating the second penetrating holes are remnants from when the plurality of second penetrating holes was formed in a distributed manner in the semiconductor layer.

DESCRIPTION OF THE PREFERRED EMBODIMENTS

First Embodiment

An embodiment of a stencil mask will be described below with reference to figures. A stencil mask of the present embodiment is used for limiting an irradiation area of ionized atoms to a predetermined shape on the surface of the semiconductor substrate and locally introducing ionized atoms into the semiconductor substrate. The area where the ionized atoms are introduced and the area where the ionized atoms are not introduced are controlled by the stencil mask. When the stencil mask of the present embodiment is utilized, it is possible to form the ion introducing area in a loop shape at the surface of the semiconductor substrate. Moreover, the ion introducing area is not restricted to being formed in a loop shape, but can be formed in various shapes by modifying the pattern of penetrating holes formed in the stencil mask.

A simple description of the figures will be given first. FIG. 1 is a longitudinal cross-sectional view schematically showing the basic configuration of a stencil mask 10. Since FIG. 1 schematically shows the basic concept of the stencil mask 10 of the present embodiment, it does not conform with the configuration of the embodiment shown in FIG. 2. The stencil mask 10 comprises a flat semiconductor stack 40 in which a first semiconductor layer 20 (an example of a first layer) and a second semiconductor layer 30 (an example of a second layer) are stacked. Although this will be described in detail later, a plurality of patterns are formed in the semiconductor stack 40, these patterns corresponding with a plurality of ion introducing areas in a surface portion of a semiconductor substrate.

Figure 2:
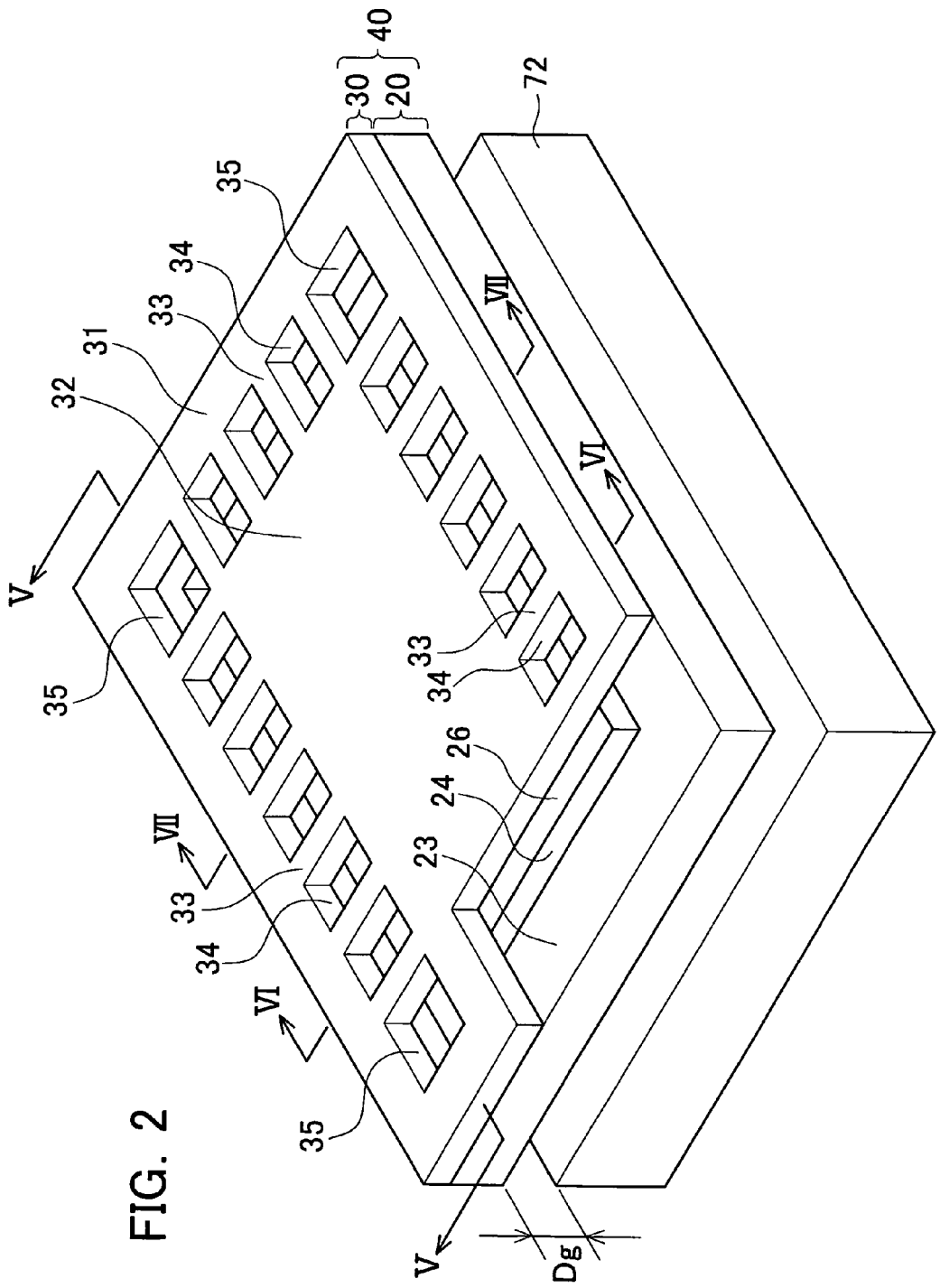
FIG. 2 is an enlarged perspective view of essential parts of a semiconductor stack of the stencil mask.

FIG. 2 is an enlarged perspective view of essential parts of the semiconductor stack 40 of the stencil mask 10 of the present embodiment. The configuration shown in FIG. 2 shows one of the pluralities of patterns formed in the semiconductor stack 40. The pattern shown in FIG. 2 corresponds to the irradiation area that forms a loop. A plurality of patterns the same as the pattern shown in FIG. 2 may be formed in the semiconductor stack 40, or patterns differing from the pattern shown in FIG. 2 may be formed therein. With the stencil mask 10, the plurality of ion introducing areas can be formed at the surface portion of a semiconductor substrate 72 by performing irradiation a single time.

Figure 3:
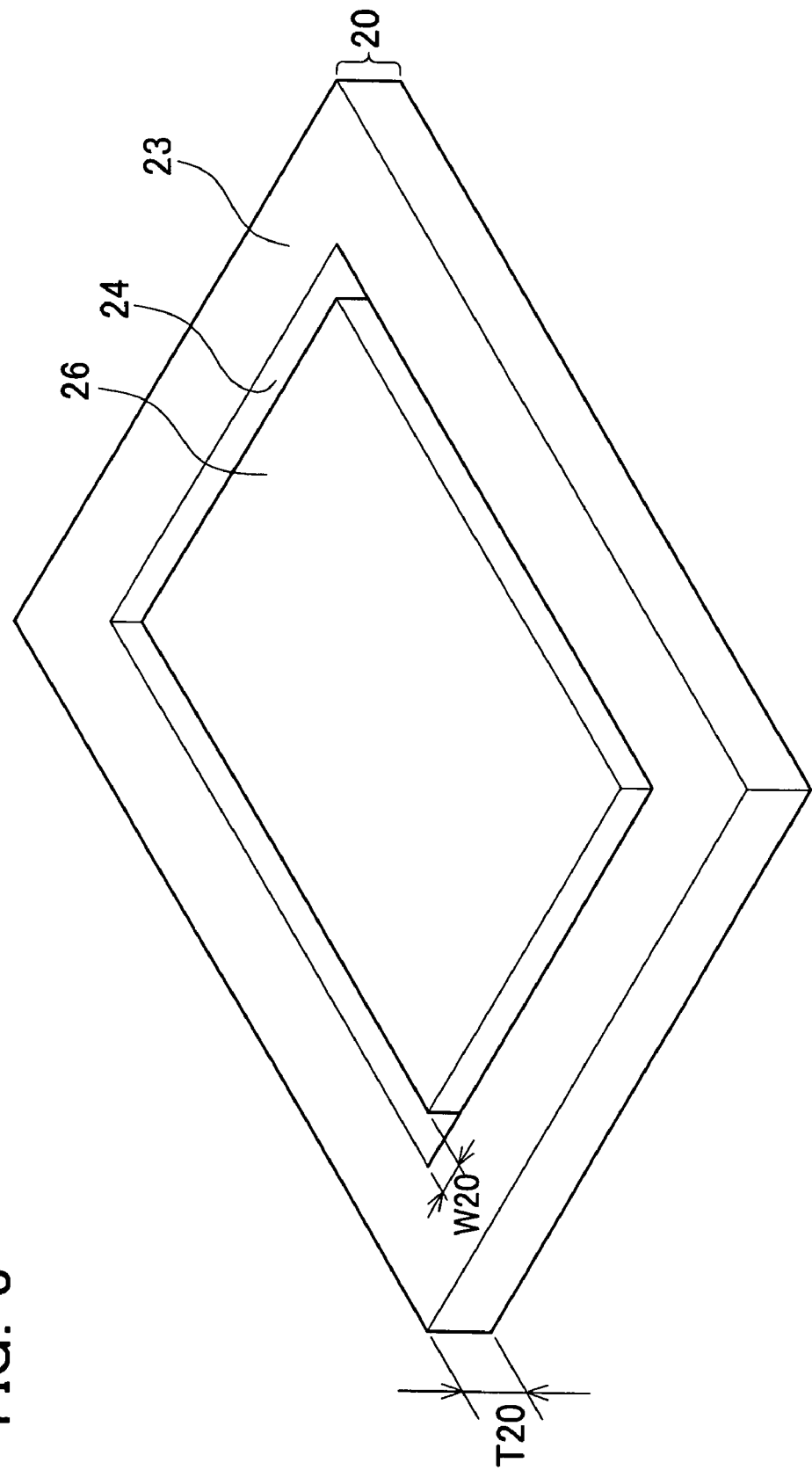
FIG. 3 is an enlarged perspective view of essential parts of a first semiconductor layer.
Figure 4:
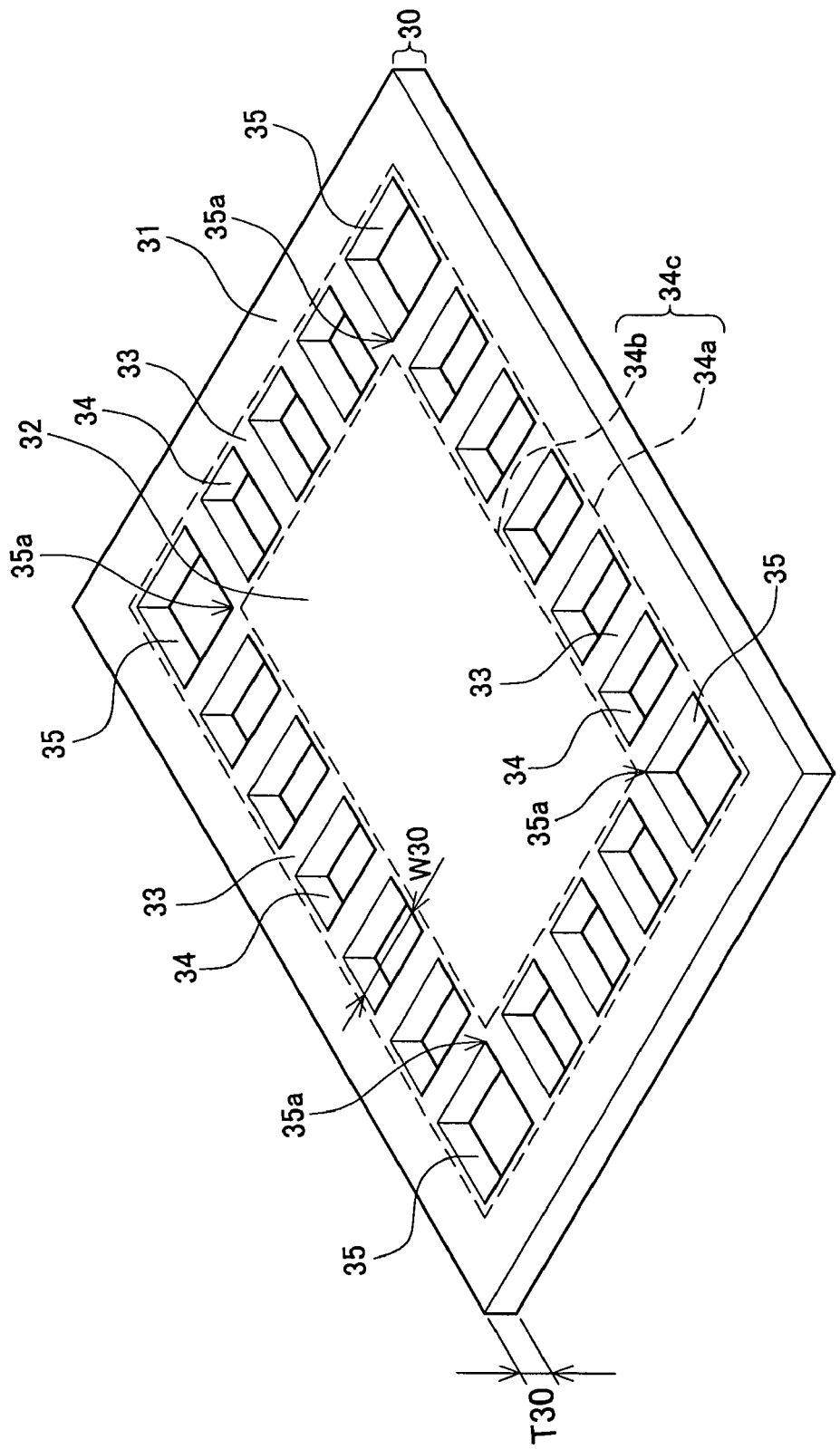
FIG. 4 is an enlarged perspective view of essential parts of a second semiconductor layer.
Figure 5:
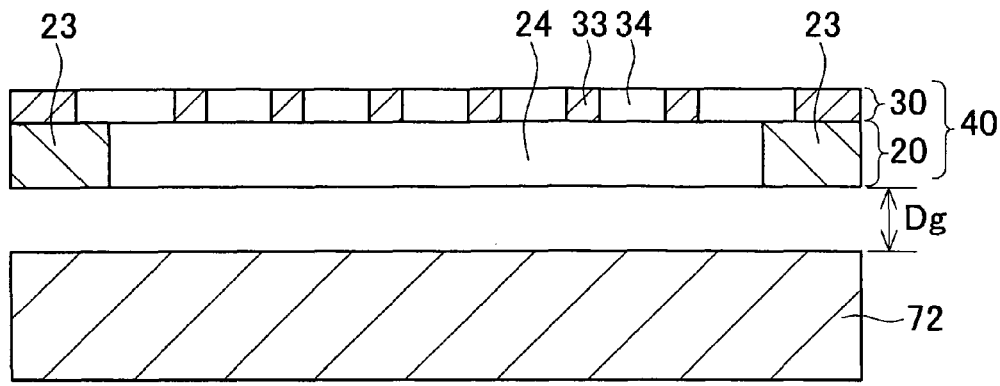
FIG. 5 is a cross-sectional view along the line V-V of FIG. 2.
Figure 6:
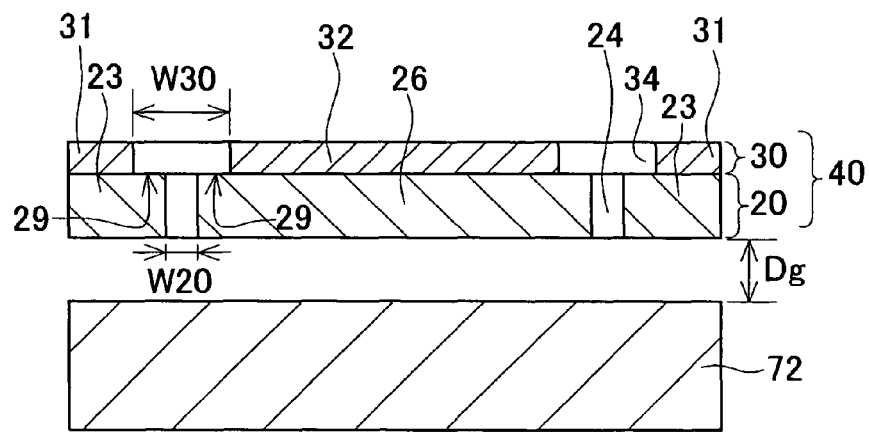
FIG. 6 is a cross-sectional view along the line VI-VI of FIG. 2.
Figure 7:
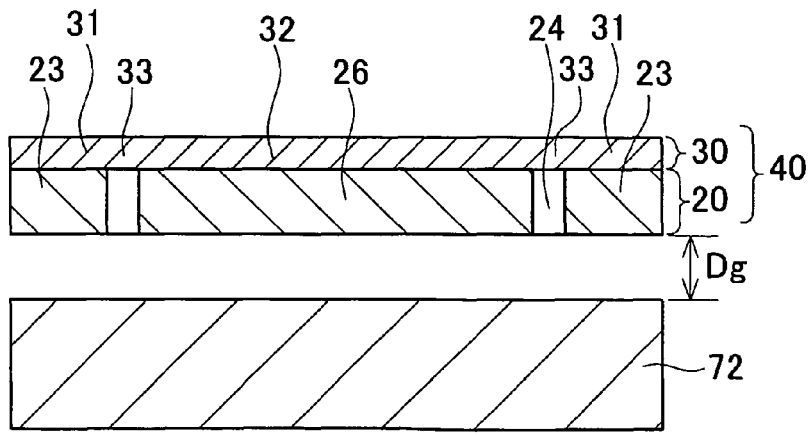
FIG. 7 is a cross-sectional view along the line VII-VII of FIG. 2.

FIG. 3 is an enlarged perspective view of essential parts of the first semiconductor layer 20 in the semiconductor stack 40. FIG. 4 is an enlarged perspective view of essential parts of the second semiconductor layer 30 in the semiconductor stack 40. The first semiconductor layer 20 and the second semiconductor layer 30 have been shown separately in FIG. 3 and FIG. 4 for the purpose of clarity. FIG. 5 is a cross-sectional view along the line V-V of FIG. 2. FIG. 6 is a cross-sectional view along the line VI-VI of FIG. 2. FIG. 7 is a cross-sectional view along the line VII-VII of FIG. 2.

When the stencil mask 10 is utilized and the ionized atoms are irradiated, the ionized atoms are irradiated from the top side of the page in FIGS. 1~7. With the stencil mask 10, the first semiconductor layer 20 is disposed at a side of the stencil mask 10 that faces toward the semiconductor substrate 72, and the second semiconductor layer 30 is disposed at a side of the stencil mask 10 to which the charged particles are irradiated.

Figure 8:
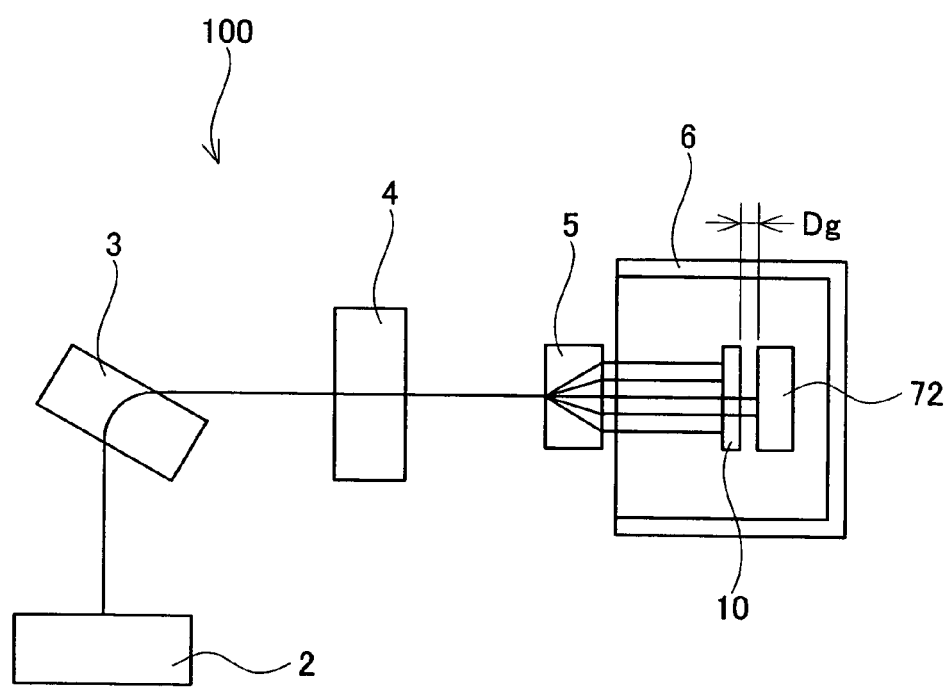
FIG. 8 shows the configuration of an ion implantation device.

An ion implantation device 100 (an example of a charged particle irradiation device) in which the stencil mask 10 is disposed will now be described with reference to FIG. 8. The ion implantation device 100 comprises an ion source 2 (an example of a charged particle generator) for generating ionized atoms, a mass analyzer 3 for selecting required ionized atoms from among the ionized atoms that have been generated, an accelerator 4 that accelerates the selected ionized atoms, and an irradiation chamber 6 in which the semiconductor substrate 72 is disposed. The stencil mask 10 is disposed above (at an anterior side of) the semiconductor substrate 72. The stencil mask 10 is disposed between the accelerator 4 and the semiconductor substrate 72. The ionized atoms accelerated by the accelerator 4 are swept out by a scanner 5, and are irradiated in an approximately planar manner toward the stencil mask 10. Ionized atoms that have passed through the penetrating holes or windows formed in the stencil mask 10 are irradiated to a surface of the semiconductor substrate 72, and are introduced into a surface portion of the semiconductor substrate 72. Viewed from the stencil mask 10, the side with the accelerator 4 is termed the upper side or the anterior side, and in the present specification the side with the semiconductor substrate 72 is termed the lower side or posterior side.

Next, the figures will be described in detail.

As shown in FIG. 1, the stencil mask 10 comprises the semiconductor stack 40 in which the first semiconductor layer 20 and the second semiconductor layer 30 are stacked. A surrounding support layer 62 is formed in a loop along a peripheral part of the semiconductor stack 40, and is separated from the semiconductor stack 40 by a silicon oxide layer 52. The surrounding support layer 62 is considerably thicker than the semiconductor stack 40. The silicon oxide layer 52 and the surrounding support layer 62 increase the mechanical rigidity of the semiconductor stack 40, and prevent damage to the stencil mask 10 while the stencil mask 10 is being manufactured. Further, when the stencil mask 10 is installed above (to the anterior of) the semiconductor substrate 72 (see FIG. 8), the surrounding support layer 62 is also utilized as a contacting part for other installing devices. A cooling device (not shown) may be formed on the surrounding support layer 62. In this case, heat from the semiconductor stack 40 can escape to the exterior via the silicon oxide layer 52 and the surrounding support layer 62. A first penetrating hole 24 is formed in the first semiconductor layer 20 in a shape corresponding to the ion introducing area of the semiconductor substrate 72. A plurality of second penetrating holes 34 is widely distributed in an area of the second semiconductor layer 30 that corresponds to the irradiation area of the semiconductor substrate 72. The first penetrating hole 24 and the second penetrating holes 34 communicate, and pass from one face of the semiconductor stack 40 to the other face thereof. In order to show clearly that the first semiconductor layer 20 is being supported by the second semiconductor layer 30, FIG. 1 shows a cross-section in which some of the first penetrating hole 24 and the second penetrating holes 34 do not communicate. Although some of the first penetrating hole 24 and the second penetrating holes 34 do not communicate in the cross-section in FIG. 1, they do communicate in the other longitudinal cross-sections of the semiconductor stack 40. The ionized atoms can thus reach the surface of the semiconductor substrate 72 by passing through the second penetrating holes 34 and the first penetrating holes 24.

It should be noted here that FIG. 1 shows the stencil mask 10 schematically in order to aid understanding of the basic configuration of the stencil mask 10, and differs greatly from the actual configuration.

FIG. 2 shows one of the pluralities of patterns formed in the semiconductor stack 40. In FIG. 2, part of the second semiconductor layer 30 has been cut away to make the figure clearer, and a part of the first penetrating hole 24 of the first semiconductor layer 20 has been exposed. The first semiconductor layer 20 of the stencil mask 10 is disposed above (to the anterior of) the surface of the semiconductor substrate 72 and is separated therefrom by a distance Dg. Further, as will be described below, the stencil mask 10 has the advantage that this distance Dg can be reduced. As a result, when the stencil mask 10 is utilized, it is possible to control a scattering phenomenon of the ionized atoms after these ionized atoms have passed through the first penetrating hole 24, and it is possible to form a very small ion introducing area on the surface portion of the semiconductor substrate 72.

In order to aid comprehension of the first semiconductor layer 20 and the second semiconductor layer 30 that compose of the semiconductor stack 40, the first semiconductor layer 20 and the second semiconductor layer 30 will be described with reference to FIG. 3 and FIG. 4 respectively.

As shown in FIG. 3, the first penetrating hole 24 is formed in a rectangular loop in the first semiconductor layer 20. The first penetrating hole 24 passes through the first semiconductor layer 20, and the first semiconductor layer 20 is thus separated by the first penetrating hole 24 into an outer first semiconductor layer 23 and an inner first semiconductor layer 26. Unless there is something to connect the outer first semiconductor layer 23 and the inner first semiconductor layer 26, the two will become separated. The first penetrating hole 24 is provided in a shape that corresponds to the irradiation area of the semiconductor substrate 72. In this example, the irradiation area has a pattern in which it forms a loop on the surface of the semiconductor substrate 72. The first penetrating hole 24 therefore also forms a loop that corresponds to the loop-shape irradiation area of the semiconductor substrate 72. A thickness T20 of the first semiconductor layer 20 can be adjusted in accordance with the pattern of the irradiation area to be made on the semiconductor substrate 72. As will be described below, mechanical rigidity of the first semiconductor layer 20 is increased by the second semiconductor layer 30, and consequently the thickness T20 of the first semiconductor layer 20 can be reduced. If the thickness T20 of the first semiconductor layer 20 is reduced, a very small first penetrating hole 24 can be formed by etching in the first semiconductor layer 20 even if the aspect ratio of the etching is limited. The thickness T20 of the first semiconductor layer 20 of the present embodiment is approximately 20 μm. A hole width W20 of the first penetrating hole 24 is approximately 1 μm. The aspect ratio of the first penetrating hole 24 is approximately 20. With this aspect ratio, the RIE (Reactive Ion Etching) method or the like can be utilized to etch the first penetrating hole 24.

Furthermore, utilizing the thin first semiconductor layer 20 is also required for other reasons than the limitations of the aspect ratio during etching. For example, if a thick first semiconductor layer 20 is utilized, a part of the ionized atoms that enter the first penetrating hole 24 are introduced into side walls of the first penetrating hole 24, and the amount of ionized atoms that pass through the first penetrating hole 24 is therefore reduced. If the thin first semiconductor layer 20 is utilized, the phenomenon is controlled wherein ionized atoms are introduced to the side walls of the first penetrating hole 24, and the amount of ionized atoms that pass through the first penetrating hole 24 can therefore be kept large. That is, it is preferred that the thickness T20 of the first semiconductor layer 20 is thin not just in order to make the first penetrating hole 24 small, but also to increase the amount of ionized atoms that pass through the first penetrating hole 24.

As shown in FIG. 4, the plurality of second penetrating holes 34 is widely distributed in an area 34c (hereafter termed distributing area 34c) that is enclosed within the broken line 34a and the broken line 34b. The distributing area 34c corresponds to the shape of the irradiation area on the surface of the semiconductor substrate 72. The second penetrating holes 34 communicate with the first penetrating hole 24. The distributing area 34c is formed as an approximate loop extending along the first penetrating hole 24 that forms a loop in the first semiconductor layer 20. The distributing area 34c forms a rectangular loop in the second semiconductor layer 30, and has four corner penetrating holes 35. Devices to control deformation are provided in the corner penetrating holes 35. This will be described in detail below.

The second semiconductor layer 30 is separated by the distributing area 34c into an outer second semiconductor layer 31 and an inner second semiconductor layer 32. Beam members 33 are present between the second penetrating holes 34 in the distributing area 34c. The beam members 33 connect the outer second semiconductor layer 31 and the inner second semiconductor layer 32. Viewed along the traveling path of the ionized atoms, the distributing area 34c is larger than the shape of the first penetrating hole 24. Specifically, a hole width W30 of the second penetrating holes 34 is larger than the hole width W20 of the first penetrating hole 24. This hole width W30 refers to the distance between a side wall and an opposing side wall in the semiconductor layer 30, these side walls demarcating the penetrating holes 34. The distance between a side wall of a beam member 33 and an opposite side wall of the beam member 33 is not included in the hole width W30. The second penetrating holes 34 introduce the ionized atoms toward the first penetrating hole 24. As a result, when the distributing area 34c is larger than the shape of the first penetrating hole 24, a large amount of the ionized atoms can be guided toward the first penetrating hole 24. As shown in FIG. 6, the hole width W30 of the second penetrating holes 34 is greater than the hole width W20 of the first penetrating hole 24. A step 29 is formed between the first penetrating hole 24 and the second penetrating holes 34. When the hole width W30 of the second penetrating holes 34 is greater than the hole width W20 of the first penetrating hole 24, masking caused by the second semiconductor layer 30 does not occur (the beam members 33 are an exception: this will be described below). Many of the ionized atoms that have passed through the second penetrating holes 34 are guided toward the first penetrating hole 24.

There is no particular restriction as to a thickness T30 of the second semiconductor layer 30. The thickness T30 of the second semiconductor layer 30 can be adjusted freely so as to obtain a desired mechanical strength, heat capacity, etc.

As shown in FIG. 4, the plurality of beam members 33 is formed in the distributing area 34c. The beam members 33 pass across the distributing area 34c that separates the outer second semiconductor layer 31 and the inner second semiconductor layer 32. The beam members 33 are formed at constant intervals along the distributing area 34c that forms a loop. Viewed along the traveling path of the ionized atoms, the beam members 33 bridges the inner first semiconductor layer 26 and outer first semiconductor layer 23 that are separated by the first penetrating hole 24. As will be described later, the stencil mask 10 utilizes the scattering phenomenon of the ionized atoms. Due to the scattering phenomenon, the ionized atoms can be led into the surface of the substrate 72 at areas below the beam members 33, even though these beam members 33 cover portions of the first penetrating hole 24. With the stencil mask 10, the ion introducing area can be formed by performing irradiation a single time rather than a plurality of times.

The inner first semiconductor layer 26 and the inner second semiconductor layer 32 are fixed. The outer first semiconductor layer 23 and the outer second semiconductor layer 31 are fixed. The inner second semiconductor layer 32 and the outer second semiconductor layer 31 are connected by the beam members 33. As a result, the inner first semiconductor layer 26 is supported by the outer first semiconductor layer 23 via the outer second semiconductor layer 31, the beam members 33 and the inner second semiconductor layer 32. The inner first semiconductor layer 26 is thus prevented from becoming detached even though the first penetrating hole 24 forms a loop.

The area near the side walls of the second semiconductor layer 30 where the second penetrating holes 34 are demarcated is strengthened by providing the beam members 33, and deformation of this part can therefore be controlled. Since the beam members 33 are formed at constant intervals, the entirety of the side walls of the second penetrating holes 34 can be prevented from deforming. Further, since the first semiconductor layer 20 and the second semiconductor layer 30 are stacked, the area near the side walls defining the first penetrating hole 24 is also strengthened by the beam members 33 and the second semiconductor layer 30. The deformation of the area near the side walls of the first penetrating hole 24 can therefore also be suppressed.

In the stencil mask 10, deformation of the area near the side walls of both the first penetrating hole 24 and the second penetrating holes 34 is controlled by providing the beam members 33. It is thus possible to prevent problems wherein the range of the ion introducing area shifts, or wherein the dimensions of the ion introducing area change.

By utilizing the technique of the stencil mask 10, deformation of the first semiconductor layer 20 can be controlled. It is possible to form a variety of patterns of the first penetrating hole 24 or a plurality of the first penetrating holes in the first semiconductor layer 20. By utilizing the technique of the stencil mask 10, a variety of very small first penetrating holes 24 can be formed, and a variety of very small irradiation areas can be formed.

The stencil mask 10 is formed utilizing the semiconductor stack 40 in which the first semiconductor layer 20 and the second semiconductor layer 30 are stacked. The total thickness of the first semiconductor layer 20 and the second semiconductor layer 30 together can be increased by stacking the first semiconductor layer 20 and the second semiconductor layer 30. It is thus possible to increase the total thickness of the first semiconductor layer 20 and the second semiconductor layer 30 while the thickness T20 of the first semiconductor layer 20 remains thin. The total thickness of the first semiconductor layer 20 and the second semiconductor layer 30 can thus be increased while the thickness of the first second layer 20 is being restricted by the limit of the aspect ratio. That is, it is possible to increase the total thickness of the first semiconductor layer 20 and the second semiconductor layer 30 while making it possible to form very small irradiation areas due to the very small first penetrating holes 24. When the total thickness of the first semiconductor layer 20 and the second semiconductor layer 30 is increased, the heat capacity of the semiconductor stack 40 in which the first semiconductor layer 20 and the second semiconductor layer 30 are combined is greater than when the first semiconductor layer 20 is isolated. When the heat capacity is increased, the temperature of the semiconductor stack 40 can be prevented from rising excessively when the ionized atoms are introduced even though the ionized atoms collide with the semiconductor stack 40. Deformation of the semiconductor stack 40 can thus be suppressed.

The characteristics of the stencil mask 10 can be pinpointed as follows. With the stencil mask 10, the mechanical rigidity and heat capacity of the first semiconductor layer 20 can be improved by utilizing the second semiconductor layer 30. A thin first semiconductor layer 20 can therefore be utilized. When the first semiconductor layer 20 is thinner, very small irradiation areas can be formed. By stacking the second semiconductor layer 30 on the first semiconductor layer 20, the stencil mask 10 is successful in forming very small irradiation areas.

When the technique of the stencil mask 10 is utilized, a variety of very small irradiation areas can be formed on the surface of the semiconductor substrate 72, and deformation of the first semiconductor layer 20 and the second semiconductor layer 30 can be controlled extremely well.

Next, the advantage will be described, with reference to figures, that the stencil mask 10 can be used with a short distance (see Dg of FIGS. 2, 5, 6, 7, and 8) between the stencil mask 10 and the semiconductor substrate 72.

Figure 9:
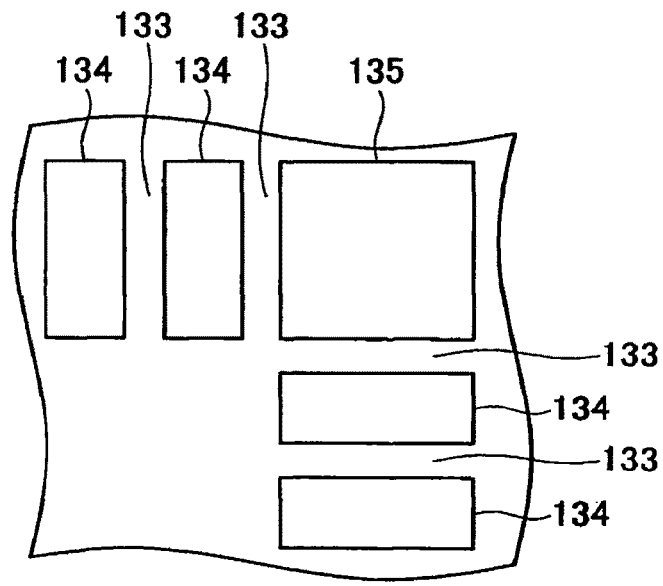
FIG. 9 is a plan view of essential parts of a stencil mask with conventional configuration.

FIG. 9 shows a plan view of essential parts of a layer of a conventional stencil mask. The vicinity of a corner penetrating hole 135 has been enlarged in FIG. 9. In the conventional configuration in FIG. 9, penetrating holes 134 and beam members 133 are both formed in one semiconductor layer.

Figure 10:
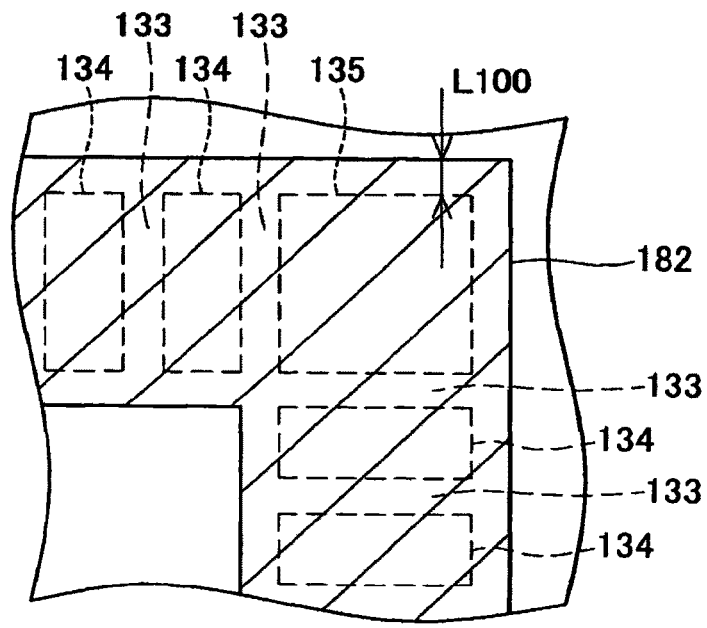
FIG. 10 is a plan view of essential parts of a stencil mask with conventional configuration and an area into which ionized atoms have been introduced.

FIG. 10 shows the range (the range shown by hatching) of an ion irradiation area 182 obtained when the stencil mask with conventional configuration was utilized. The penetrating holes 134 and 135 corresponding with the ion irradiation area 182 have been overlapped and are shown by broken lines. If the ion irradiation area 182 is formed using the scattering phenomenon of ionized atoms, the ionized atoms must pass below the beam members 133. It is therefore desirable that there is a greater distance between a semiconductor substrate and a stencil mask. When the two are separated by a greater distance, the ionized atoms can scatter in a horizontal direction by a distance corresponding to the width of the beam members 133, and the ion irradiation g area 182 can therefore also be formed below the beam members 133.

However, when there is a great distance between the semiconductor substrate and the stencil mask, the scattering phenomenon of the ionized atoms causes the problem that the ion irradiation area 182 is formed across a wide range. As shown in FIG. 10, with the conventional stencil mask, the ion irradiation area 182 is formed widely across a range that extends towards the periphery by the distance L100 from the pattern of the penetrating holes 134 and 135. It is therefore difficult to make the ion irradiation area 182 very small when the conventional stencil mask is used.

Figure 11:
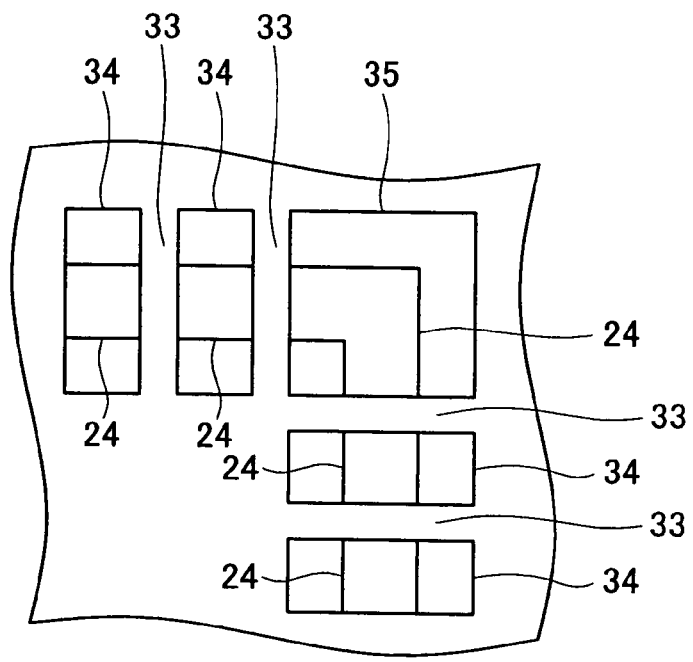
FIG. 11 is a plan view of essential parts of the stencil mask.

FIG. 11 shows a plan view of essential parts of the semiconductor stack 40 of the stencil mask 10 of the present embodiment. This configuration of the stencil mask 10 allows the scattering phenomenon of the ionized atoms to be utilized effectively.

In the stencil mask 10, the beam members 33 are formed in the second layer 30, but not formed in the first penetrating hole 24. The ionized atoms that pass through the second penetrating holes 34 consequently scatter within the first penetrating hole 24 while they pass through the first penetrating hole 24. Consequently the ionized atoms enter spaces below the beam members 33 of the second layer 30 while they pass through the first penetrating hole 24. The ionized atoms that have passed through the first penetrating holes 24 can therefore be irradiated outwards from the first penetrating hole 24 according to the pattern of the first penetrating hole 24. Shadowing effect by the beam members 33 of the second layer 30 appear only to a small extent in the irradiation pattern of the ionized atoms that have passed through the first penetrating holes 24. In the stencil mask 10, the beam members 33 are formed in the second layer 30, and are not formed in the first layer 20. As a result, the masking effect caused by the beam members 33 can be eliminated by adjusting the thickness of the first semiconductor layer 20. The distance Dg between the first semiconductor layer 20 and the semiconductor substrate 72 can therefore be reduced.

Figure 12:
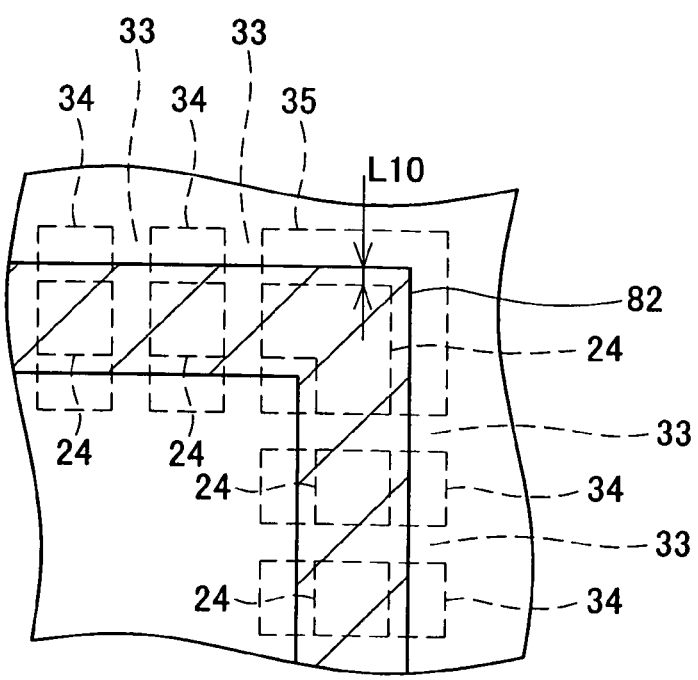
FIG. 12 is a plan view of essential parts of the stencil mask and an area into which ionized atoms have been introduced.

As shown in FIG. 12, since the distance Dg between the first semiconductor layer 20 and the semiconductor substrate 72 can be reduced, it is possible to control the scattering phenomenon of the ionized atoms that have passed through the first penetrating hole 24, and consequently an ion irradiation area 82 that is obtained has a narrow range. When the stencil mask 10 is utilized, the ion irradiation area 82 is formed that extends toward the periphery only by the distance L10 from the pattern of the first penetrating hole 24. It is clear from a comparison of L100 of FIG. 10 and L10 of FIG. 12 that the width of the ion irradiation area 82 extending towards the periphery can be kept small, since the distance Dg can be reduced when the stencil mask 10 is utilized. As a result, the ion irradiation area 82 can be made extremely small when the stencil mask 10 is utilized.

Next, the density distribution of the ionized atoms that have been introduced into the ion irradiation area will be described with reference to FIGS. 13~19. The longitudinal cross-sections of FIG. 13, FIG. 18 and FIG. 19 correspond to the longitudinal cross-section shown in FIG. 5.

Figure 13:
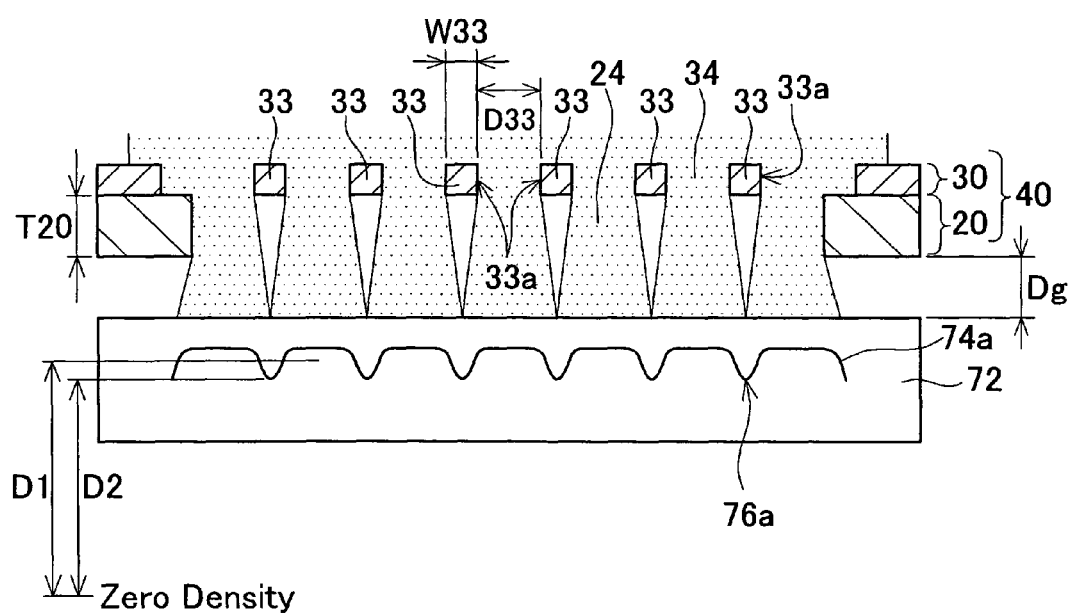
FIG. 13 is a longitudinal cross-sectional view showing the stencil mask and the density distribution of ionized atoms.

FIG. 13 is an example wherein side walls of each beam member 33 are parallel to the traveling path of the ionized atoms. That is, this is equivalent to the embodiment described above. The solid line 74a shown within the semiconductor substrate 72 shows the density distribution of the ionized atoms that have been introduced into the surface of the semiconductor substrate 72.

The density distribution of the ionized atoms is strongly affected by the following. A desired density distribution can be obtained by adjusting the following factors appropriately.

(1) A distance D33 between a side wall 33a of one beam member 33 and a side wall 33a of an adjacent beam member 33.

(2) A width W33 of the beam member 33.

(3) The distance Dg between the first semiconductor layer 20 and the substrate 72.

(4) The thickness T20 of the first semiconductor layer 20.

(5) A scattering angle a σ[deg] of the beam (the ionized atoms).

Figure 14:
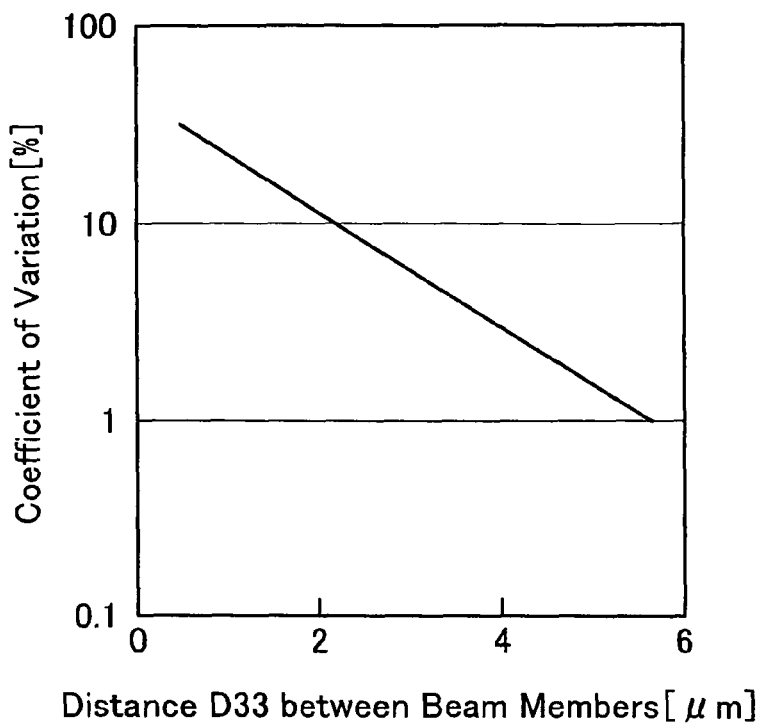
FIG. 14 shows a relation between a coefficient of variation and a distance D33 between beam members.

FIG. 14 shows a relation between coefficient of variation and the distance D33. The coefficient of variation shows the maximum unevenness of the density of the ionized atoms that have been introduced into the substrate 72. D1 in FIG. 13 shows an average density of the ionized atoms that have been introduced into the substrate 72. D2 in FIG. 13 shows a minimum density of the ionized atoms that have been introduced into the substrate 72. D2 is smaller than D1 due to shadowing effect by the beam members 33. The coefficient of variation is calculated by the equation of (D1−D2)/D1× 100%. As is clear from FIG. 14, increasing the distance D33 causes a decrease in the coefficient of variation. A large distance D33 is desirable.

Figure 15:
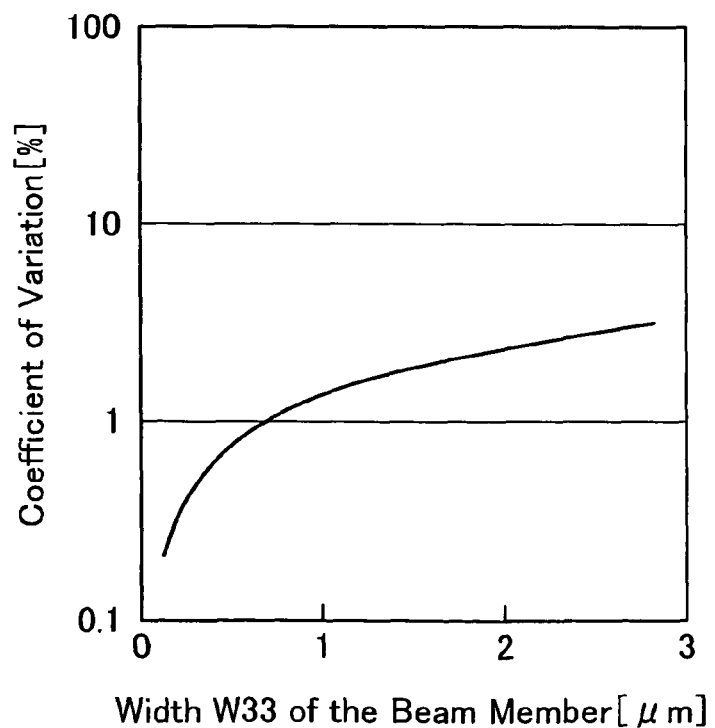
FIG. 15 shows a relation between the coefficient of variation and a width W33 of the beam member.

FIG. 15 shows the relation between the coefficient of variation and the width W33. As is clear from FIG. 15, decreasing the width W33 causes a decrease in the coefficient of variation. A small width W33 is desirable.

Figure 16:
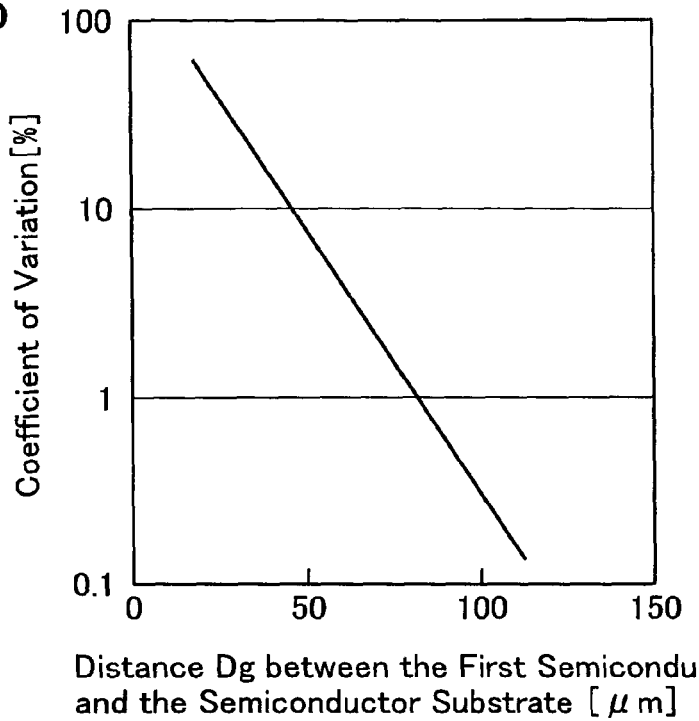
FIG. 16 shows a relation between the coefficient of variation and a distance Dg between the first semiconductor layer and a substrate.

FIG. 16 shows the relation between the coefficient of variation and the distance Dg. As is clear from FIG. 16, increasing the distance Dg causes a decrease in the coefficient of variation. However, as described above, when the distance Dg is increased, the ion introducing area is formed across a wider range. This should be avoided if a very small ion introducing area is desired.

Figure 17:
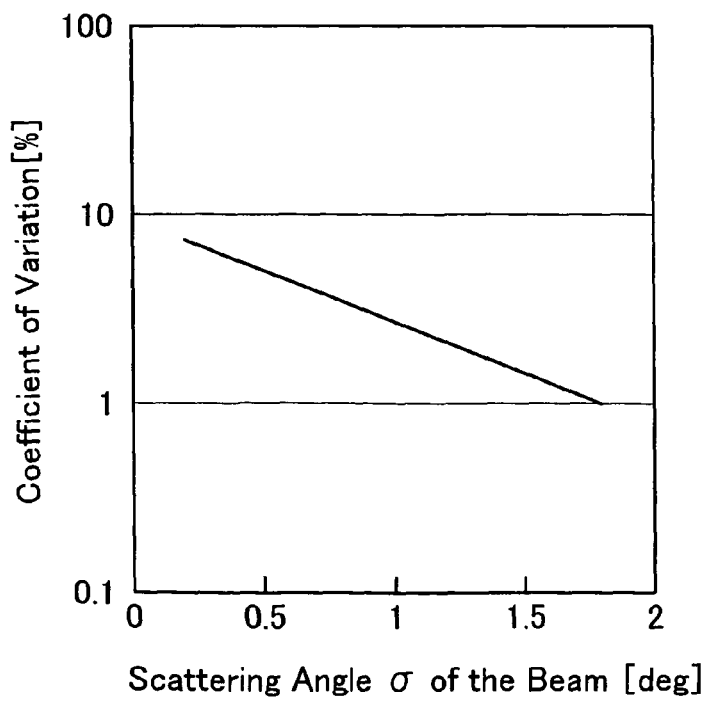
FIG. 17 shows a relation between the coefficient of variation and a scattering angle σ of the beam member.

FIG. 17 shows a relation between the coefficient of variation and the scattering angle σ(deg) of the beam (the ionized atoms). As is clear from FIG. 17, increasing the scattering angle σ causes a decrease in the coefficient of variation. However, if the scattering angle σ is increased, the ion introducing area is formed across a wider range. This should be avoided if a very small ion introducing area is desired.

A desired density distribution of the ion introducing area can be obtained by adjusting the shape of beam members 33 appropriately in accordance with the above factors (1)~(5). The coefficient of variation of the density distribution of the ionized atoms when the factors (1)~(5) are combined can be represented by a numerical formula (I) below.

$$\text{the coefficient of variation} = \qquad\qquad\qquad\text{(I)}$$
$$\exp(5.1 - 0.084 \times D33 + 3.1 \times W33 - 0.079 \times Dg - 1.2 \times \sigma -$$
$$0.11 \times D33 \times W33 - 0.71 \times (w33)^2 + 0.012 \times D33 \times Dg)$$

As shown in FIG. 13, when the side walls 33a of each beam member 33 are parallel, the ionized atoms have a lower density on the surface of the semiconductor substrate 72 at areas below the beam members 33 than in the other areas (see 76a or D2 in FIG. 13). However, the coefficient of variation can be kept to approximately 10% or less, as shown in FIGS. 14~17.

It is possible to utilize in a positive manner the phenomenon that the beam members 33 cause the uneven density distribution within ionized atoms irradiation area. In some types of semiconductor devices, the characteristics is improved by having the ionized atoms distributed with an uneven density. In this case, the shape of the beam members 33 can be adjusted appropriately utilizing the factors (1)~(5) and the numerical formula (I) so as to obtain the desired density distribution.

It may be desirable that the ionized atoms are distributed with a more even density. This requirement can be met by modifying the shape of the side walls of each the beam member 33.

Figure 18:
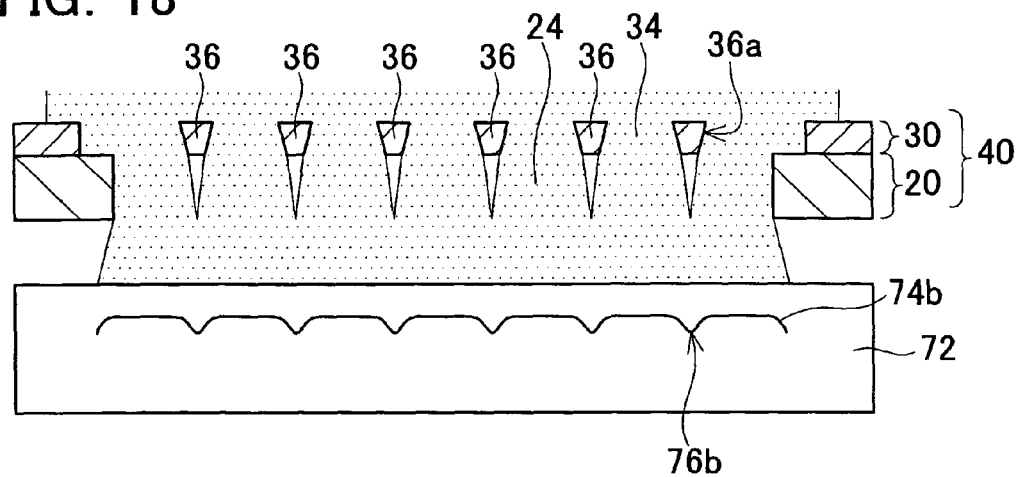
FIG. 18 shows a longitudinal cross-sectional view of essential parts of the stencil mask having taper-shaped beam members, and shows the density distribution of the ionized atoms.

As shown in FIG. 18, side walls 36a of the beam member 36 are inclined so that the width of the beam member decreases along the traveling path of the ionized atoms. That is, the distance between adjacent second penetrating holes 34 is shorter at the side of the beam members 36 from which the ionized atoms proceed toward the semiconductor substrate 71, and is longer at the side of the beam members 36 to which the ionized atoms are irradiated. One could also say that the beam member 36 has a longer width at the side away from the semiconductor substrate 72, and has a shorter width at the side by the semiconductor substrate 72. As a result, a large amount of ionized atoms are able to penetrate into a space below the beam members 36. The density distribution 74b of the ionized atoms in the semiconductor substrate 72 is therefore more even (see 76b). Further, since the beam member 36 has a longer width at the side away from the semiconductor substrate 72, the outer second semiconductor layer 31 (see FIG. 2) and the inner second semiconductor layer 32 (see FIG. 2) can be joined firmly by the beam members 36. Forming the side walls 36a of the beam members 36 in an inclined manner ensures the mechanical rigidity of the stencil mask 10 while allowing the density distribution of the ionized atoms to be made even.

Figure 19:
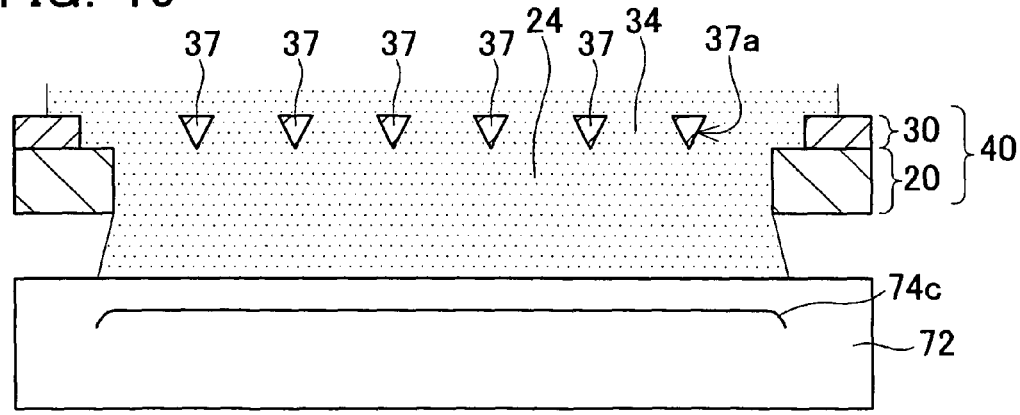
FIG. 19 shows a longitudinal cross-sectional view of essential parts of another stencil mask having taper-shaped beam members, and shows the density distribution of the ionized atoms.

As shown in FIG. 19, when side walls 37a of beam member 37 are more inclined, the density distribution of the ionized atoms introduced into the semiconductor substrate 72 can be made more even. As shown in FIG. 19, when end part of the beam member 37 at the semiconductor substrate 72 side are formed as acute angle, there is almost no variation of density distribution 74c in the semiconductor substrate 72.

Figure 45:
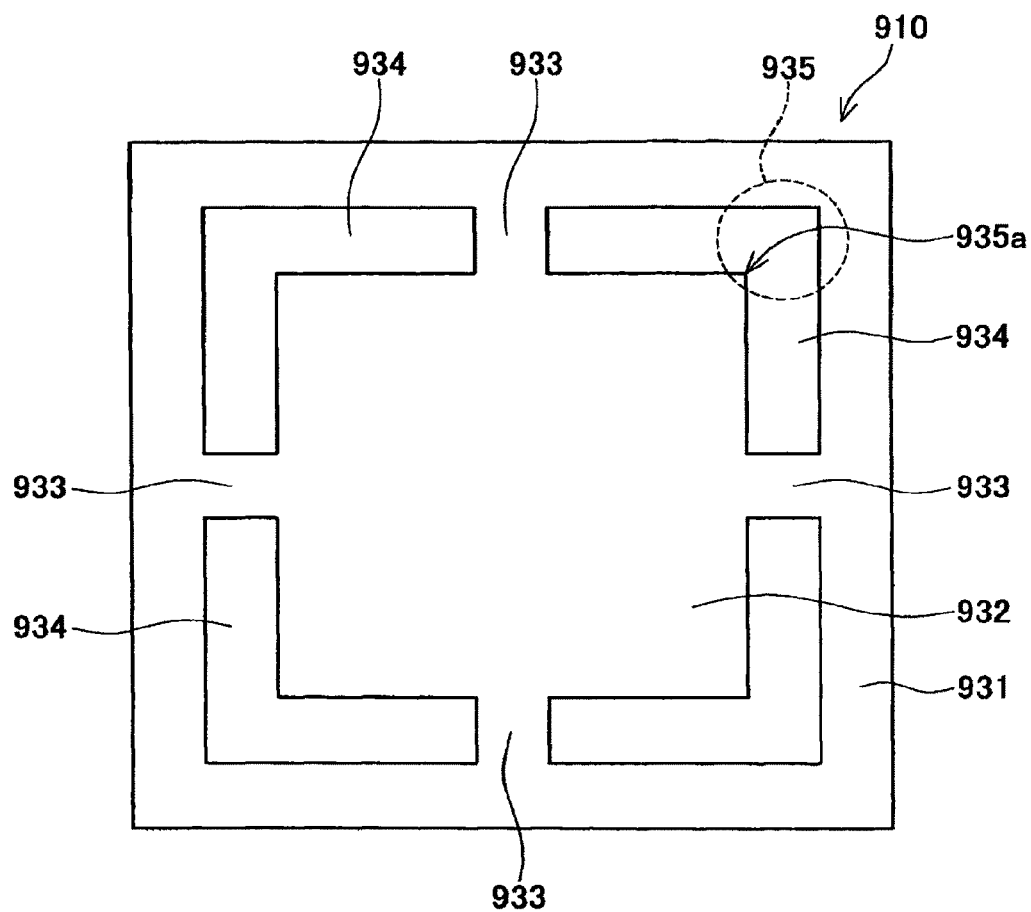
FIG. 45 shows a plan view of a conventional stencil mask.

Next, other characteristics of the stencil mask 10 will be described. FIG. 45 schematically shows a stencil mask 910 of Japanese Patent Application Publication No. 2002-280290. The stencil mask 910 comprises penetrating holes 934 that form a rectangular loop. An outer semiconductor layer 931 and an inner semiconductor layer 932 are joined by beam members 933. The beam members 933 are formed at approximately central parts of four edges of the inner semiconductor layer 932.

In the stencil mask 910, right angle projecting walls 935a are formed at the corners 935 of the penetrating holes 934, these right angle projecting walls 935a being formed at side walls of the inner semiconductor layer 932 that is demarcated by the penetrating holes 934. Stress readily accumulates at these right angle projecting walls 935a, and consequently deformation can readily occur.

By contrast, in the stencil mask 10 of the present embodiment, as shown in FIG. 4, the corner part penetrating holes 35 are approximately square and the beam members 33 are formed so that right angle projecting walls 35a disappear. That is, the corner part penetrating holes 35 have a convex polygonal shape and do not have projecting angles formed therein. Consequently, with the stencil mask 10, positions where stress readily accumulates are not formed in the inner semiconductor upper layer 32 and the outer semiconductor upper layer 31. Deformation of the inner semiconductor upper layer 32 and the outer semiconductor upper layer 31 can be controlled extremely well with the stencil mask 10.

Figure 20:
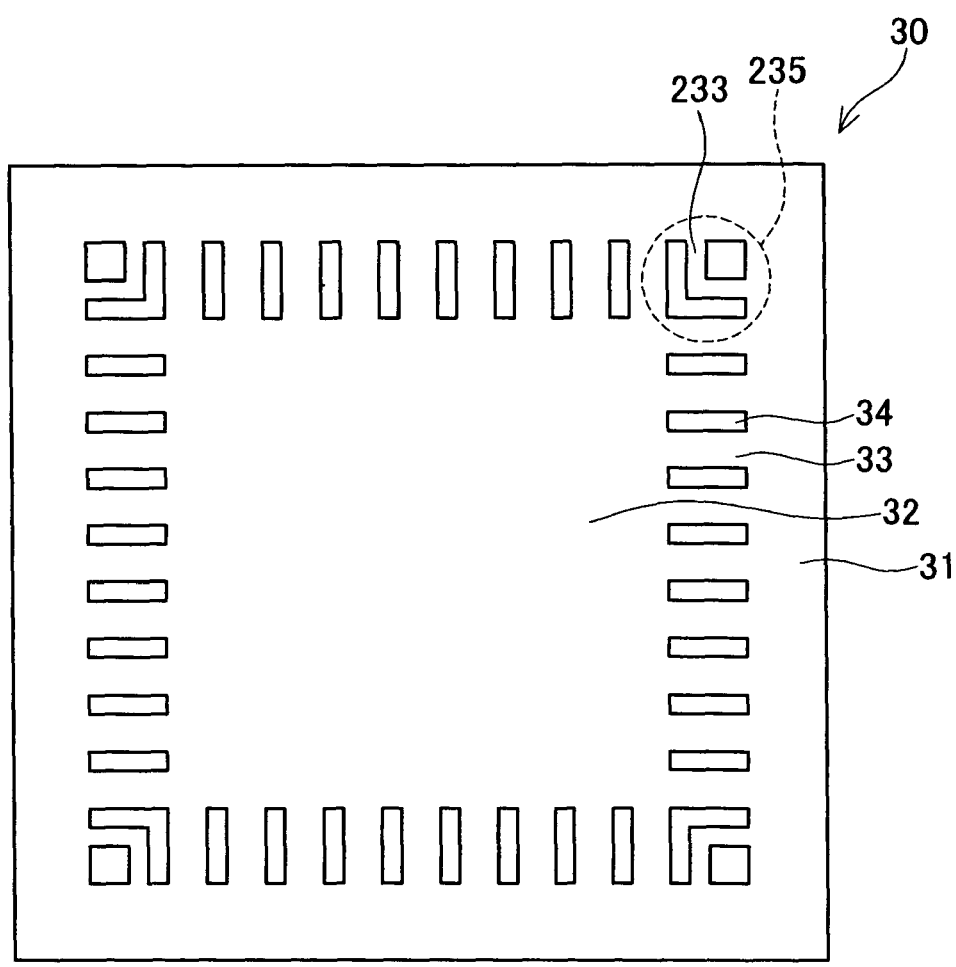
FIG. 20 shows a plan view of essential parts of a second semiconductor layer of a variant stencil mask.

FIG. 20 shows a variant of the stencil mask 10. FIG. 20 shows a plan view of essential parts of a second semiconductor layer 30 of the variant. In this variant, angled beam members 233 are formed in comer penetrating holes 235. The comer penetrating holes 35 usually have a greater area than the remaining penetrating holes 34. As a result, the following problems can readily occur: deformation near side walls of the comer penetrating holes 35 is larger than other portion, and; the amount of ionized atoms introduced below the comer penetrating holes 35 is larger than the amount of ionized atoms introduced below the penetrating holes 34. In order to solve these problems, the angled beam members 233 are formed within the comer part penetrating holes 235. Deformation of the second semiconductor layer 30 or bias in the amount of ionized atoms that are introduced is thus controlled at the comer penetrating holes 235.

Figure 21:
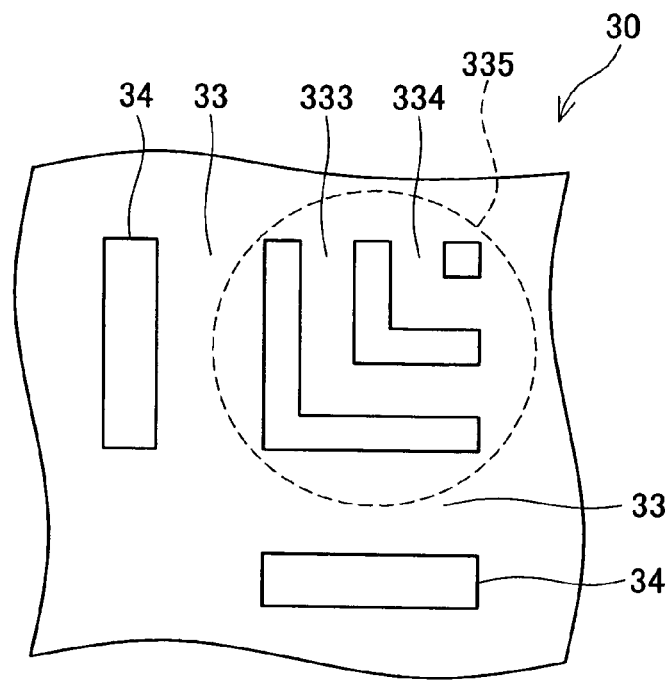
FIG. 21 shows a plan view of essential parts of a second semiconductor layer of another variant stencil mask.

FIG. 21 shows another variant of the stencil mask 10. FIG. 21 shows a plan view of essential parts of a second semiconductor layer 30 of the variant. In this variant, a plurality of angled beam members 333 and 334 is formed in comer penetrating holes 335. In this case, deformation of the second semiconductor layer 30 or bias in the amount of ionized atoms is thus controlled at the comer penetrating holes 335 to a greater extent than with the variant shown in FIG. 20.

Figure 22:
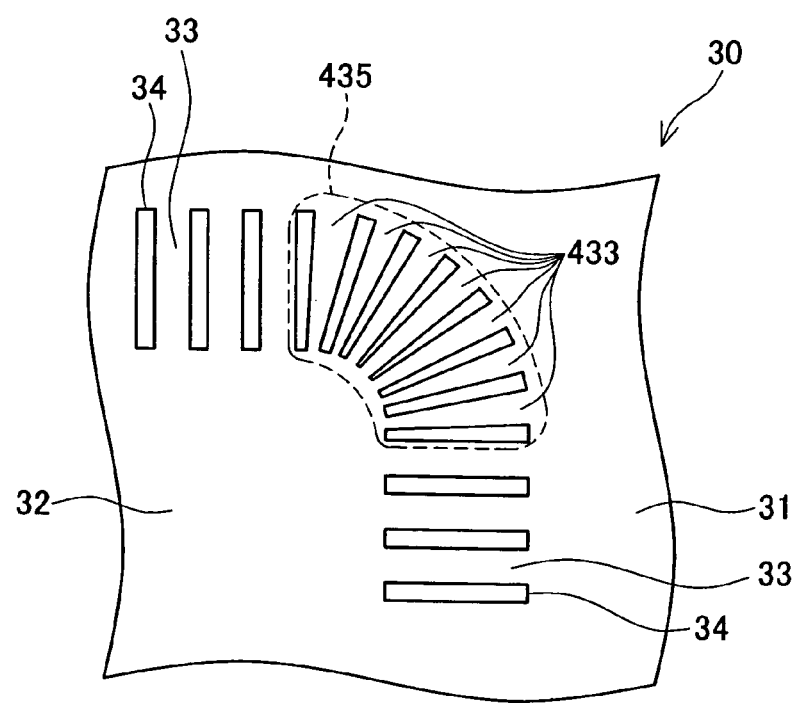
FIG. 22 shows a plan view of essential parts of a second semiconductor layer of another variant stencil mask.

FIG. 22 shows another variant of the stencil mask 10. FIG. 22 shows a plan view of essential parts of a second semiconductor layer 30 of the variant. In this variant, comer penetrating holes 435 are curved, and a plurality of comer beam members 433 is formed in each corner penetrating hole 435. The comer beam members 433 extend in a radiating shape from the inner semiconductor upper layer 32 toward the outer semiconductor upper layer 31. In this variant, deformation of the second semiconductor layer 30 or bias in the amount of ionize atoms is thus controlled at the comer penetrating holes 435 to a greater extent than with the above variant.

Figure 23:
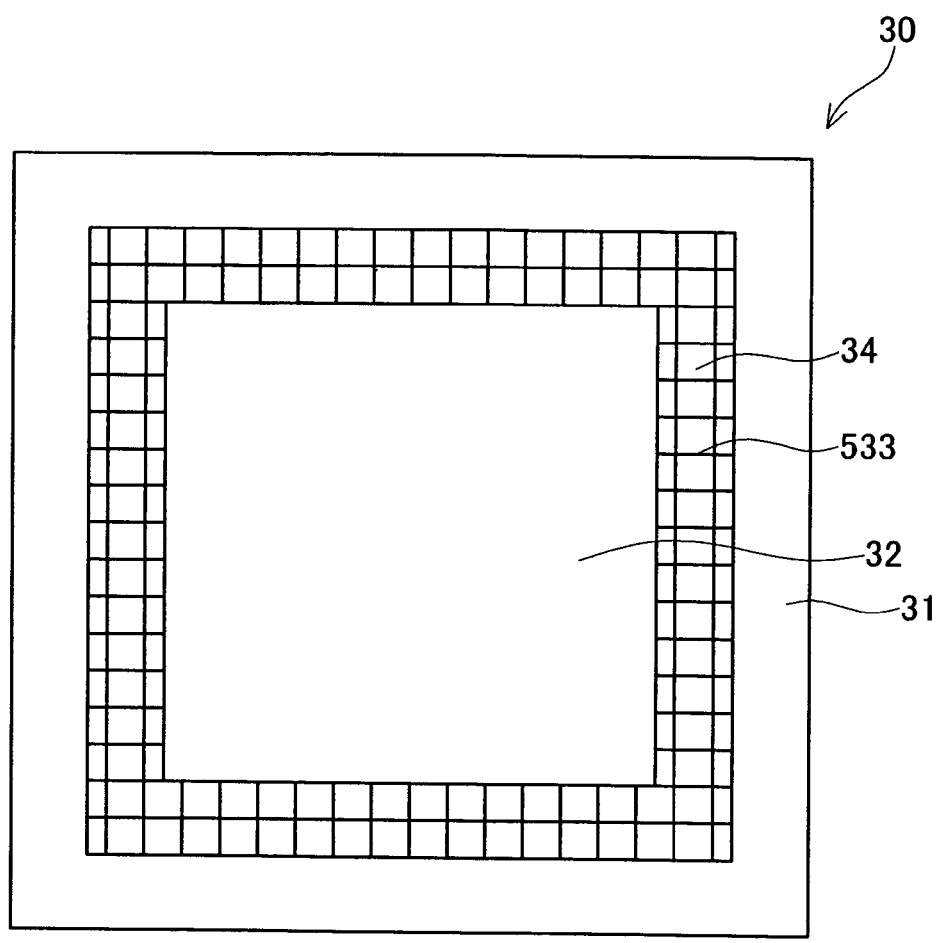
FIG. 23 shows a plan view of essential parts of a second semiconductor layer of another variant stencil mask.

FIG. 23 shows another variant of the stencil mask 10. FIG. 23 shows a plan view of essential parts of a second semiconductor layer 30 of the variant. In this variant, a plurality of square second penetrating holes 34 is formed, and lattice shaped beam members 533 are formed. The lattice shaped beam members 533 can increase the mechanical rigidity of the stencil mask even though they are narrow in width. Masking effects caused by the beam members 533 can consequently be kept small. The plurality of second penetrating holes 34 has a convex polygonal shape.

Figure 24:
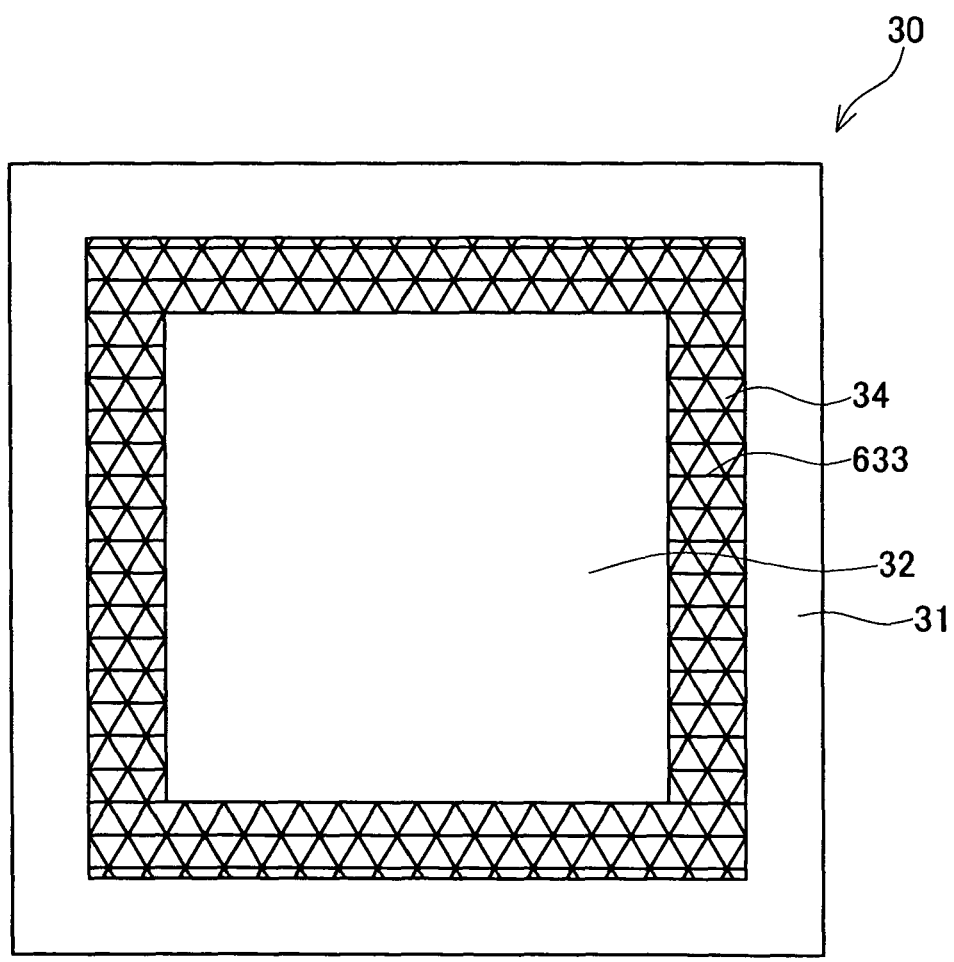
FIG. 24 shows a plan view of essential parts of a second semiconductor layer of another variant stencil mask.

FIG. 24 shows another variant of the stencil mask 10. FIG. 24 shows a plan view of essential parts of a second semiconductor layer 30 of the variant. In this variant, a plurality of triangular second penetrating holes 34 is formed. Beam members 633 extend in a plurality of directions. The beam members 633 that extend in a plurality of directions can increase the mechanical rigidity of the stencil mask even though they are narrow in width. Masking effects caused by the beam members 633 can consequently be kept small. The plurality of second penetrating holes 34 has a convex polygonal shape.

Figure 25:
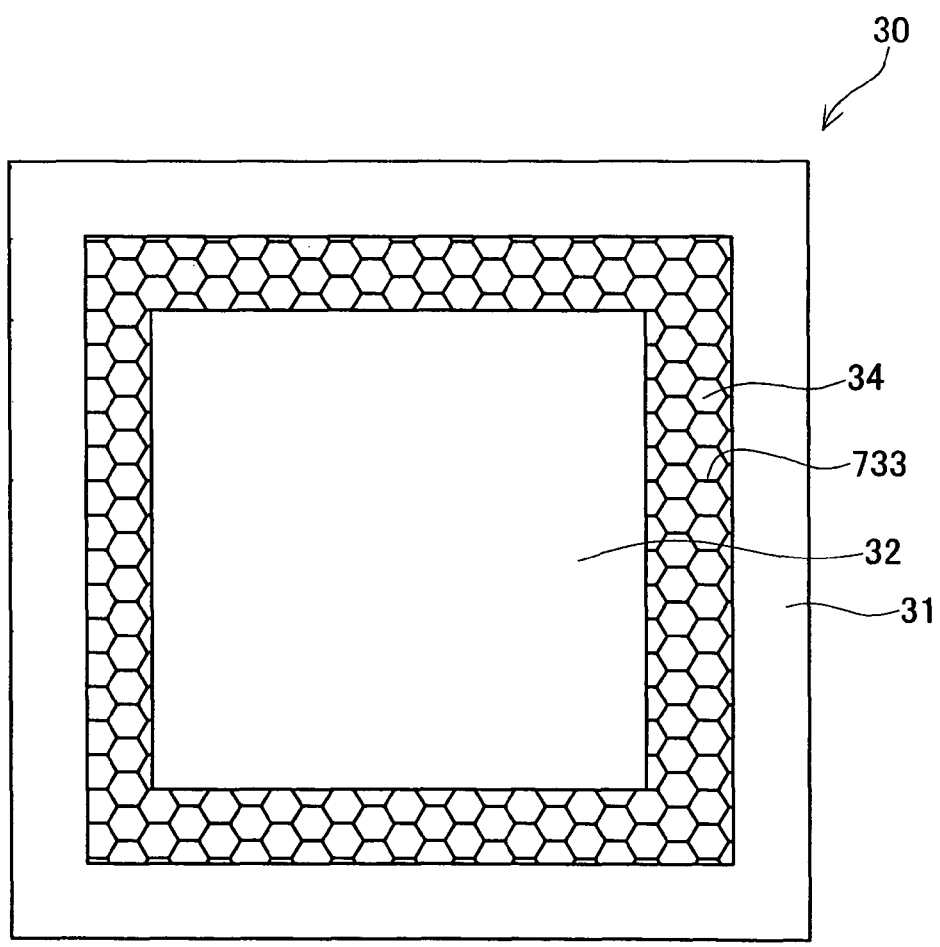
FIG. 25 shows a plan view of essential parts of a second semiconductor layer of another variant stencil mask.

FIG. 25 shows another variant of the stencil mask 10. FIG. 25 shows a plan view of essential parts of a second semiconductor layer 30 of the variant. In this variant, a plurality of hexagonal second penetrating holes 34 is formed. Beam members 733 can increase the mechanical rigidity of the stencil mask even though they are narrow in width. Masking effects caused by the beam members 733 can consequently be kept small. The plurality of second penetrating holes 34 has a convex polygonal shape.

Figure 26:
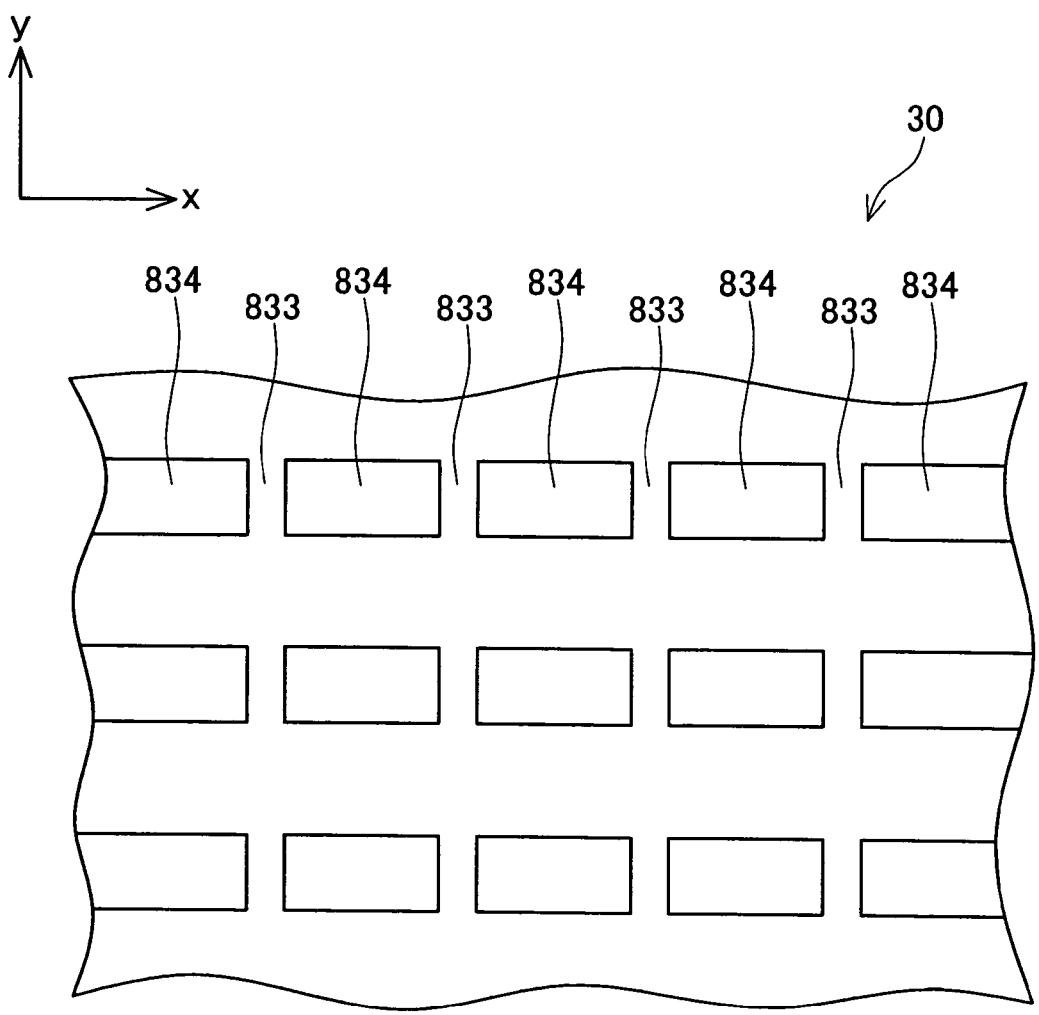
FIG. 26 shows a plan view of essential parts of a second semiconductor layer of another variant stencil mask.

FIG. 26 shows a variant of a stencil mask that differs from the stencil mask 10. FIG. 26 shows a plan view of essential parts of a second semiconductor layer 30 of the variant. In this stencil mask, a plurality of penetrating holes 834 is aligned in an x direction. These penetrating holes 834 are repeated in a y direction. The penetrating holes 834 are provided in a striped pattern. This stencil mask is utilized in the case where a striped ion introducing area is to be formed.

As shown in FIG. 26, beam members 833 are formed between the penetrating holes 834. If the beam members 833 were not formed, the penetrating holes 834 would form one long penetrating hole extending in the x direction. This type of penetrating hole has a configuration in which the vicinity of the side walls of the semiconductor layer that demarcate the penetrating hole readily becomes brittle. By providing the penetrating hole with the beam members 833 that are formed at a constant pitch, deformation near the side walls of the semiconductor layer can be controlled. Providing the beam members 833 may thus be beneficial even when the penetrating holes do not form a loop.

In the above embodiment, all of the measures have been examples applied to the second semiconductor layer 20. However, the aforementioned technique can also be utilized effectively for a stencil mask in which penetrating holes are formed in one semiconductor layer, as shown in FIG. 45.

(Method of Manufacturing the Stencil Mask 10)

The method of manufacturing the stencil mask 10 will be described next with reference to FIGS. 27~36.

Figure 27:
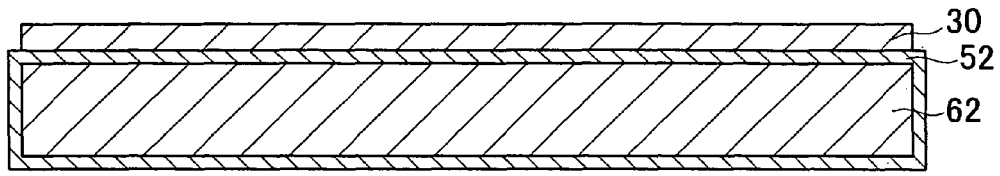
FIG. 27 shows a process of manufacturing the stencil mask (1).

First, as shown in FIG. 27, a laminated SOI (Silicon On Insulator) substrate is prepared. The SOI substrate comprises a silicon support substrate 62 (a portion thereof will form a surrounding support substrate 62 shown in FIG. 1), an embedded silicon oxide layer 52 (a portion thereof will form a silicon oxide layer 52 shown in FIG. 1), and a silicon layer 30 (a portion thereof will form the second semiconductor layer 30 shown in FIG.1).

Figure 28:
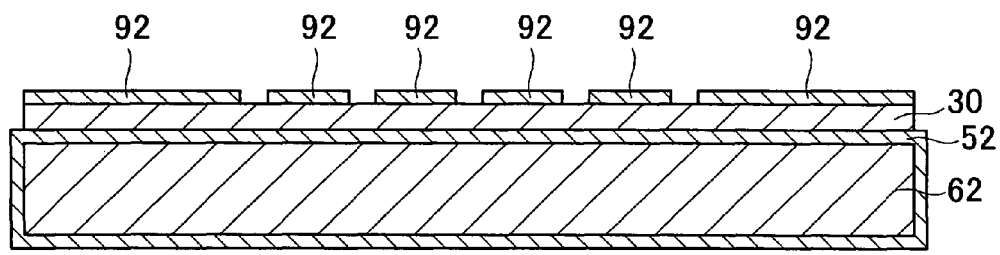
FIG. 28 shows a process of manufacturing the stencil mask (2).

As shown in FIG. 28, a first photo mask 92 is patterned onto a surface of the silicon layer 30. Penetrating holes in the first photo mask 92 correspond to the position of the second penetrating holes 34 of the stencil mask 10.

Figure 29:
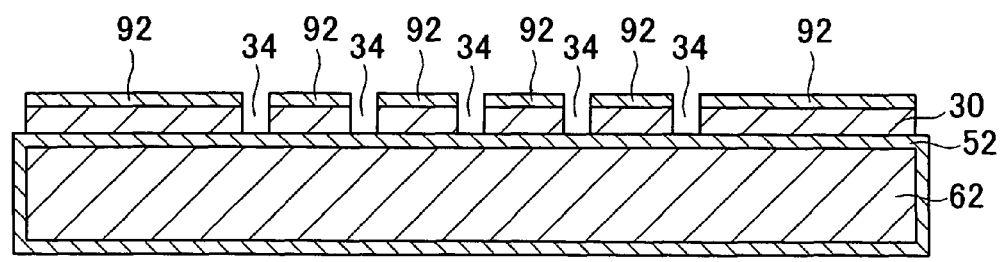
FIG. 29 shows a process of manufacturing the stencil mask (3).
Figure 30:
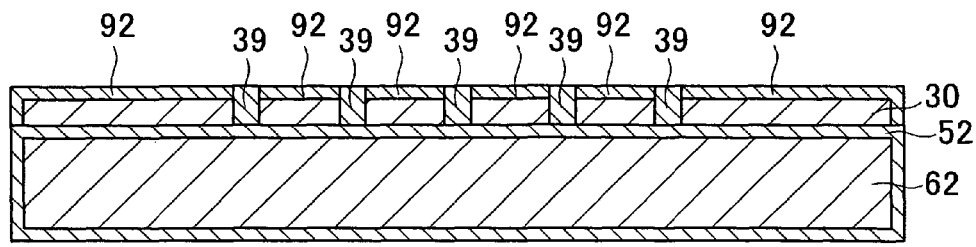
FIG. 30 shows a process of manufacturing the stencil mask (4).

Next, as shown in FIG. 29, the RIE (Reactive Ion Etching) method is utilized to etch the part of the silicon layer 30 that is exposed from the first photo mask 92, thus forming trenches 34. The configurations of the beam members 36, 37 shown in FIG. 18 and FIG. 19 can be obtained by processing side walls of the trenches 34 so that the side walls taper gradually. Processing the side walls of the trenches 34 into the tapered shape can be realized by adjusting etching conditions such as the flow ratio of the etching gas, RF power, pressure, etc. It is possible to form trenches 34 having a long width at a top side and short width at a bottom Next, as shown in FIG. 30, a silicon oxide film 39 (an example of a sacrifice material) is filled into the trenches 34 utilizing the CVD (Chemical Vapor Deposition) method. At this juncture, the embedding of the silicon oxide film 39 is satisfactory if the side walls of the trenches 34 have been processed into a gradually tapering configuration. Instead of the CVD method, SOG (Spin On Glass) material may be filled utilizing the spin application method.

Figure 31:
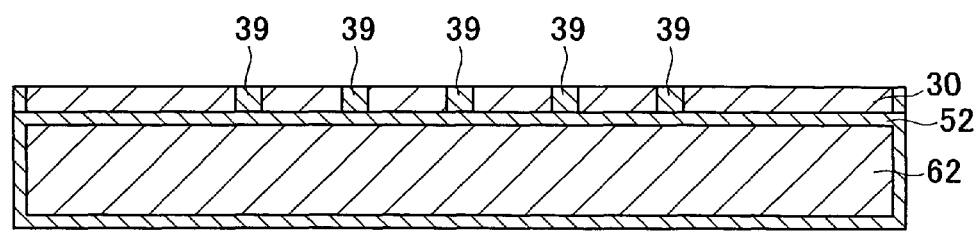
FIG. 31 shows a process of manufacturing the stencil mask (5).

Next, as shown in FIG. 31, the RIE method is utilized to etch the first photo mask 92 formed on the surface of the silicon layer 30. The etching can also be realized using the CMP (Chemical Mechanical Polish) method instead of the RIE method.

Figure 32:
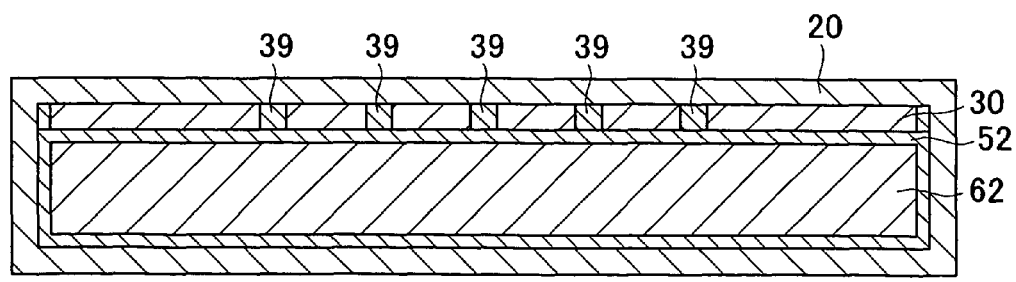
FIG. 32 shows a process of manufacturing the stencil mask (6).

Next, after a thin oxide film on the surface of the structure that was formed by means of the steps up to this point has been removed using dilute hydrofluoric acid or the like (this step is not shown), as shown in FIG. 32, the CVD method is utilized to form a polysilicon layer 20 that covers the surface of the structure. The epitaxial growth method may be utilized instead of the CVD method. Furthermore, hydrochloric acid, hydrogen gas, etc. may be utilized to remove the thin oxide film.

Figure 33:
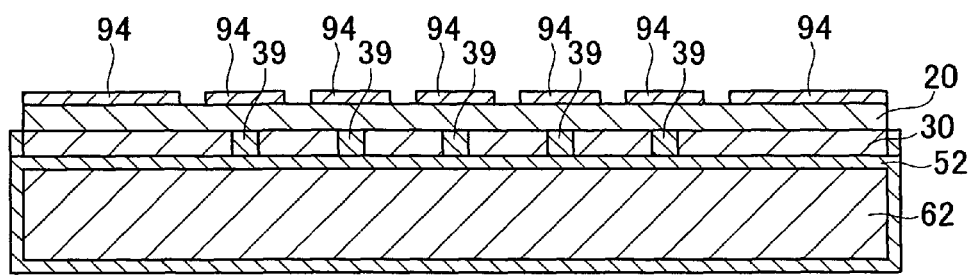
FIG. 33 shows a process of manufacturing the stencil mask (7).

Next, as shown in FIG. 33, the polysilicon layer 20 is caused to remain only on the surface of the structure by utilizing the CDE (Chemical Dry Etching) method to remove the polysilicon layer 20 formed on an bottom surface of the structure, or by performing the removal thereof after protecting the entire upper surface of the polysilicon layer 20 with a photo mask. Subsequently, a second photo mask 94 is patterned onto the surface of the polysilicon layer 20 that has been caused to remain. Penetrating hole in the second photo mask 94 correspond to the position of the first penetrating holes 24 of the stencil mask 10.

Figure 34:
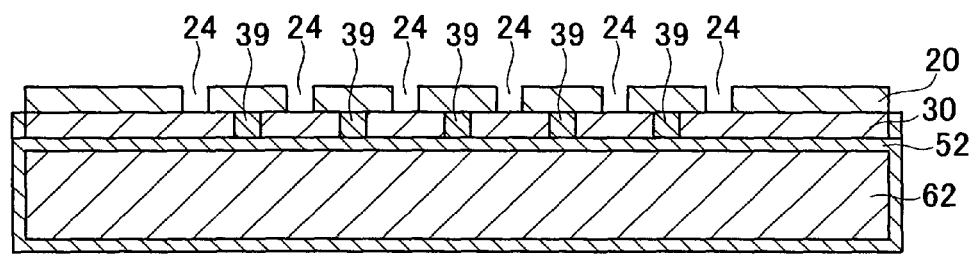
FIG. 34 shows a process of manufacturing the stencil mask (8).

Next, as shown in FIG. 34, the RIE (Reactive Ion Etching) method is utilized to etch the part of the polysilicon layer 20 that is exposed from the second photo mask 94, thus forming the first penetrating holes 24. After the first penetrating holes 24 have been formed, the etching technique is utilized to remove the second photo mask 94.

Figure 35:
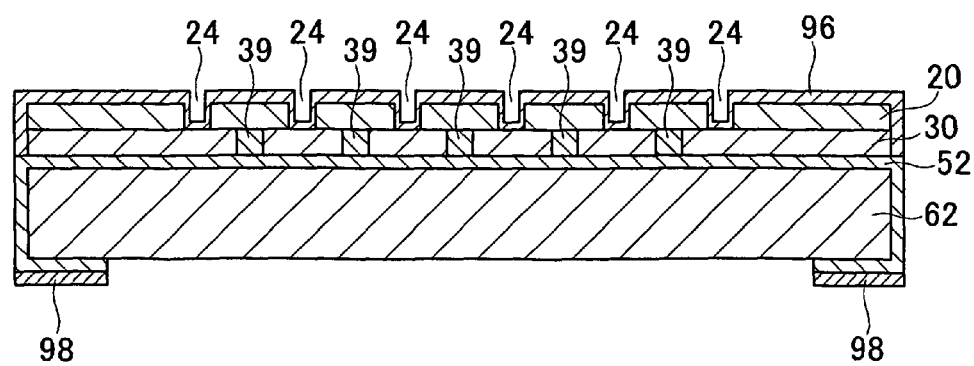
FIG. 35 shows a process of manufacturing the stencil mask (9).

Next, as shown in FIG. 35, the surface of the polysilicon layer 20 is thermally oxidized to form a thermal oxidization layer 96. After the thermal oxidization layer 96 has been formed, a third photo mask 98 is formed by patterning the bottom surface.

Figure 36:
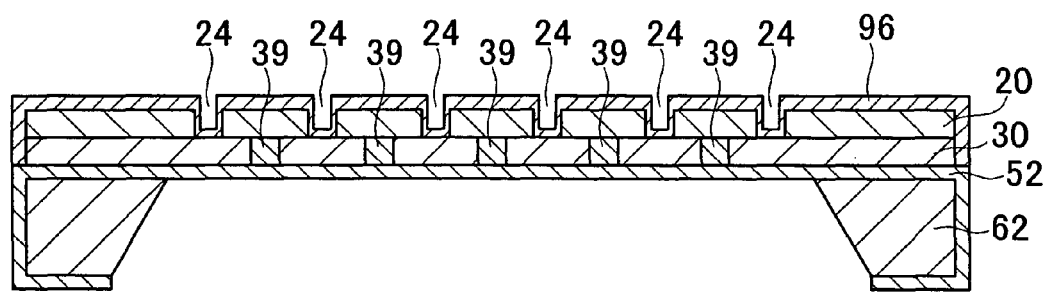
FIG. 36 shows a process of manufacturing the stencil mask (10).

Next, as shown in FIG. 36, an alkali solution is utilized to etch the silicon support substrate 62 exposed from the third photo mask 98 until the embedded silicon oxide layer 52 is exposed. Potassium hydroxide (KOH), tetramethylammonium hydroxide (TMAH), etc. can be utilized in the alkali solution.

Finally, after the exposed embedded silicon oxide layer 52 has been removed by etching, BHF (buffered hydrofluoric acid) or the like is utilized to etch the silicon oxide film 39 and the thermal oxidization layer 96 without etching the silicon layer 30 and the polysilicon layer 20. The silicon oxide film 39 and the thermal oxidization layer 96 are thus selectively removed. The stencil mask 10 shown in FIG. 1 can be obtained by performing the above steps.

Second Embodiment

Figure 37:
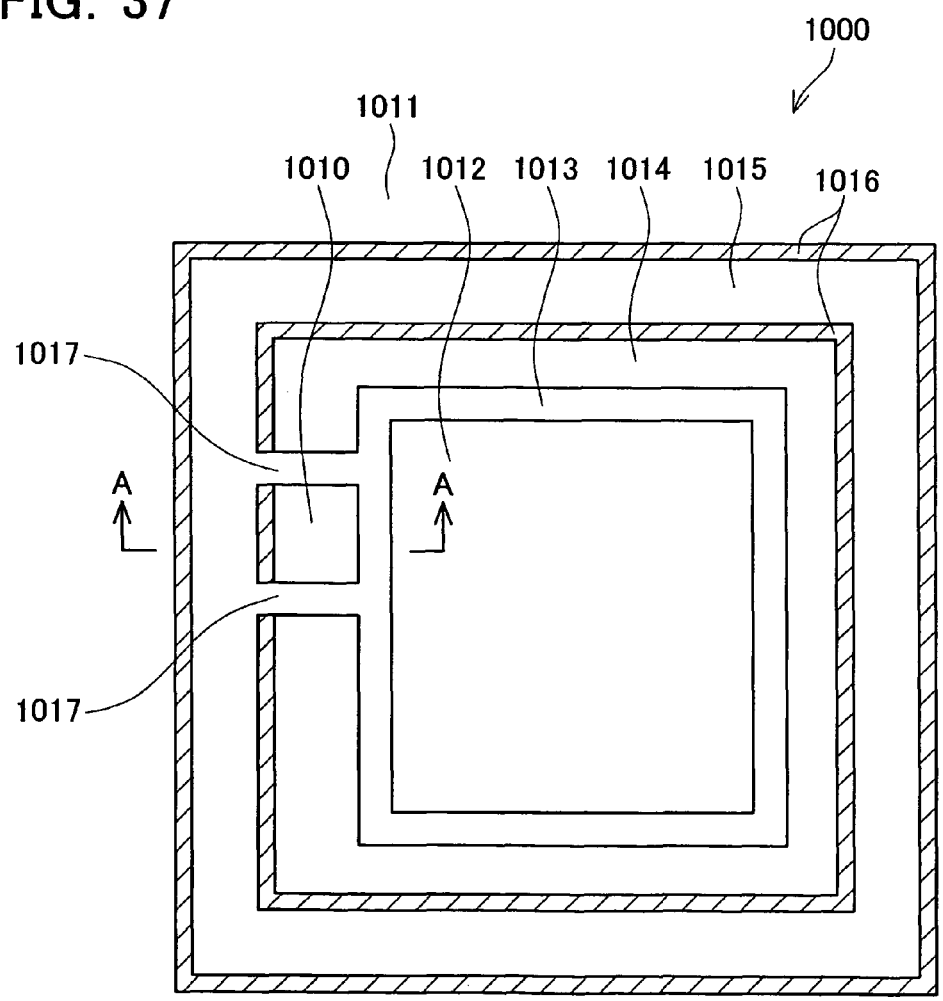
FIG. 37 shows a plan view of a level shift circuit.

In the second embodiment, the method of utilizing a stencil mask to manufacture a semiconductor device having a switching function will be described. The semiconductor device of the present embodiment is a level shift circuit (an example of a compound device) in which a high potential circuit region and a low potential circuit region are formed in one semiconductor substrate. FIG. 37 schematically shows a plan view of a level shift circuit 1000.

The level shift circuit 1000 comprises a high potential circuit region 1012, a low potential circuit region 1011, and a mediating circuit region 1010 that connects the two. A semiconductor switching element that performs switching of high voltage power is formed in the high potential circuit region 1012. A control circuit for switching the semiconductor switching element ON and OFF, and that operates at low potential is formed in the low potential circuit region 1011. The high potential circuit region 1012, the low potential circuit region 1011, and the mediating circuit region 1010 are formed in one semiconductor substrate.

Separating ion distributing regions 1016 are formed along an insulating and separating outer trench 1015. The high potential circuit region 1012 and the mediating circuit region 1010 are formed within an island portion that is insulated from and separated from the surrounding low potential circuit region 1011 by the insulating and separating outer trench 1015 and the p type separating ion distributing regions 1016.

An insulating and separating inner trench 1013 that forms a loop is formed within the island portion. The high potential circuit region 1012 is enclosed by the insulating and separating inner trench 1013. An intervening region 1014 is formed between the insulating and separating outer trench 1015 and the insulating and separating inner trench 1013. Circuits etc. are not formed in the intervening region 1014. Further, there may be cases where the insulating and separating inner trench 1013 is not formed, and in this case the intervening region 1014 becomes a peripheral region of the high potential circuit region 1012. In this case, a structure for maintaining withstand voltage may be formed in the peripheral region. It is possible to adjust the high potential circuit region 1012 to have point symmetrical configuration by forming the insulating and separating inner trench 1013.

The mediating circuit region 1010 is formed within the island portion. The mediating circuit region 1010 is enclosed by the insulating and separating outer trench 1015, the insulating and separating inner trench 1013, and insulating and separating trenches 1017. An LDMOS (Lateral Diffused MOS) is formed in the mediating circuit region 1010.

Figure 38:
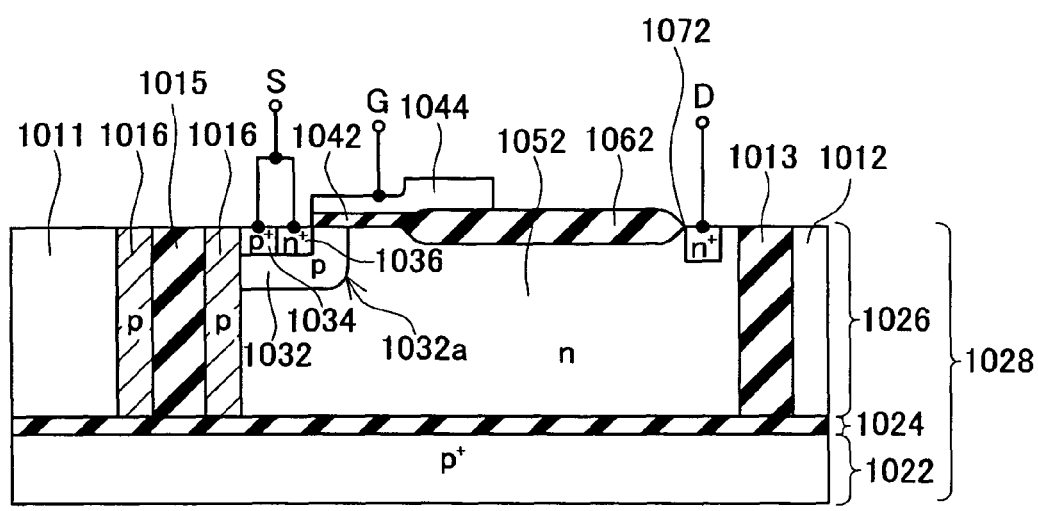
FIG. 38 shows a longitudinal cross-sectional view of an LDMOS.

FIG. 38 schematically shows a longitudinal cross-sectional view of the LDMOS formed in the mediating circuit region 1010. FIG. 38 corresponds to a longitudinal cross-section along the line A-A of FIG. 37.

The LDMOS is formed utilizing a SOI substrate 1028 comprising a $p^+$ type semiconductor lower layer 1022, an embedded insulating layer 1024, and an n type semiconductor upper layer 1026. The LDMOS is formed in the island portion (the mediating circuit region 1010) enclosed by the insulating and separating trenches 1013, 1015, and 1017. The low potential circuit region 1011 that operates at low voltage is formed in a region outside the insulating and separating outer trench 1015, at the left side in the figure. The high potential circuit region 1012 that operates at high voltage is formed in a region outside the insulating and separating inner trench 1013, at the right side in the figure. Insulating material consisting of silicon oxide is filled into the insulating and separating trenches 1013, 1015, and 1017.

Silicon or a different semiconductor material may be utilized as the semiconductor material of the SOI substrate 1028 of the present embodiment.

A drift region 1052 of the LDMOS is formed utilizing the semiconductor upper layer 1026 of the SOI substrate 1028. A p type body region 1032 is formed at a surface side of the drift region 1052. A $p^+$ type body contact region 1034 and an $n^+$ type source region 1036 are formed in the body region 1032. The source region 1036 is separated from the drift region 1052 by the body region 1032. The body contact region 1034 and the source region 1036 are connected with a source electrode S. A gate electrode 1044 faces, via a gate insulating film 1042, the body region 1032 that separates the source region 1036 and the drift region 1052.

An $n^+$ type drain region 1072 is formed at the surface side of the drift region 1052. The body region 1032 and the drain region 1072 are separated by the drift region 1052. The drain region 1072 is connected with a drain electrode D. An LOCOS oxide film 1062 is formed on a surface of the drift region 1052, this relaxing an electrical field of the surface part. Furthermore, a part of the gate electrode 1044 extends over a surface of the LOCOS oxide film 1062, allowing field plate effects to be obtained.

The source electrode S of the LDMOS is connected with the low potential circuit region 1011 via a conductor (not shown), and the drain electrode D of the LDMOS is connected with the high potential circuit region 1012 via a conductor (not shown).

The p type separating ion distributing regions 1016 are formed at the side walls that demarcate the insulating and separating outer trench 1015, and pass from the substrate surface through the body region 1032 and the drift region 1052 to the embedded insulating layer 1024. The separating ion distributing regions 1016 are formed along the side walls that demarcate the insulating and separating outer trench 1015.

As described above, the separating ion distributing regions 1016 effectively increase the insulation of the insulating and separating outer trench 1015. Furthermore, the separating ion distributing regions 1016 also have the effect of controlling the formation of a p type inversion layer at the border between the embedded insulating layer 1024 and the drift region 1052 when the LDMOS has been turned off. That is, the separating ion distributing regions 1016 promote the discharge of positive holes to the source electrode S that would otherwise accumulate in a p type inversion layer when the LDMOS has been turned off. The phenomenon wherein a depletion layer extends from the border into the drift region 1052 can thus be promoted. A wide range of the drift region 1052 can be depleted when the LDMOS has been turned off and, as a result, an LDMOS with a high withstand voltage can be obtained. Further, the separating ion distributing regions 1016 may cause a depletion layer to extend in a horizontal direction from the separating ion distributing regions 1016 into the drift region 1052. This depletion layer relieves the electrical field that can readily accumulate in a curved part 1032a of the body region 1032.

The separating ion distributing regions 1016 are not formed at the insulating and separating inner trench 1013 side at the right side in the figures. Forming a region equivalent to the separating ion distributing regions 1016 as far as this part would cause negative effects such as a reduction in the withstand voltage of the LDMOS, etc. So as to maintain withstand voltage, a region equivalent to the separating ion distributing regions 1016 must not be present at the side wall that demarcates the insulating and separating inner trench 1013.

In the present embodiment, an example was given in which the separating ion distributing regions 1016 make contact with the embedded insulating layer 1024. However, the two may equally well be separate. The separating ion distributing regions 1016 may be formed within a range in which the depletion layer extending from the separating ion distributing regions 1016 makes contact with the embedded insulating layer 1024. If the separating ion distributing regions 1016 are within this range, it is possible to promote the discharge of positive holes to the source electrode S that would otherwise accumulate in a p type inversion layer. The drift region 1052 is depleted over a wide range, and an LDMOS with high withstand voltage can be obtained.

As described above, the level shift circuit 1000 requires a technique wherein the separating ion distributing regions 1016 that form a loop are formed in the semiconductor upper layer 1026. The technique for the stencil mask described in the first embodiment can be utilized effectively when the separating ion distributing regions 1016 that form a loop are to be formed.

Figure 39:
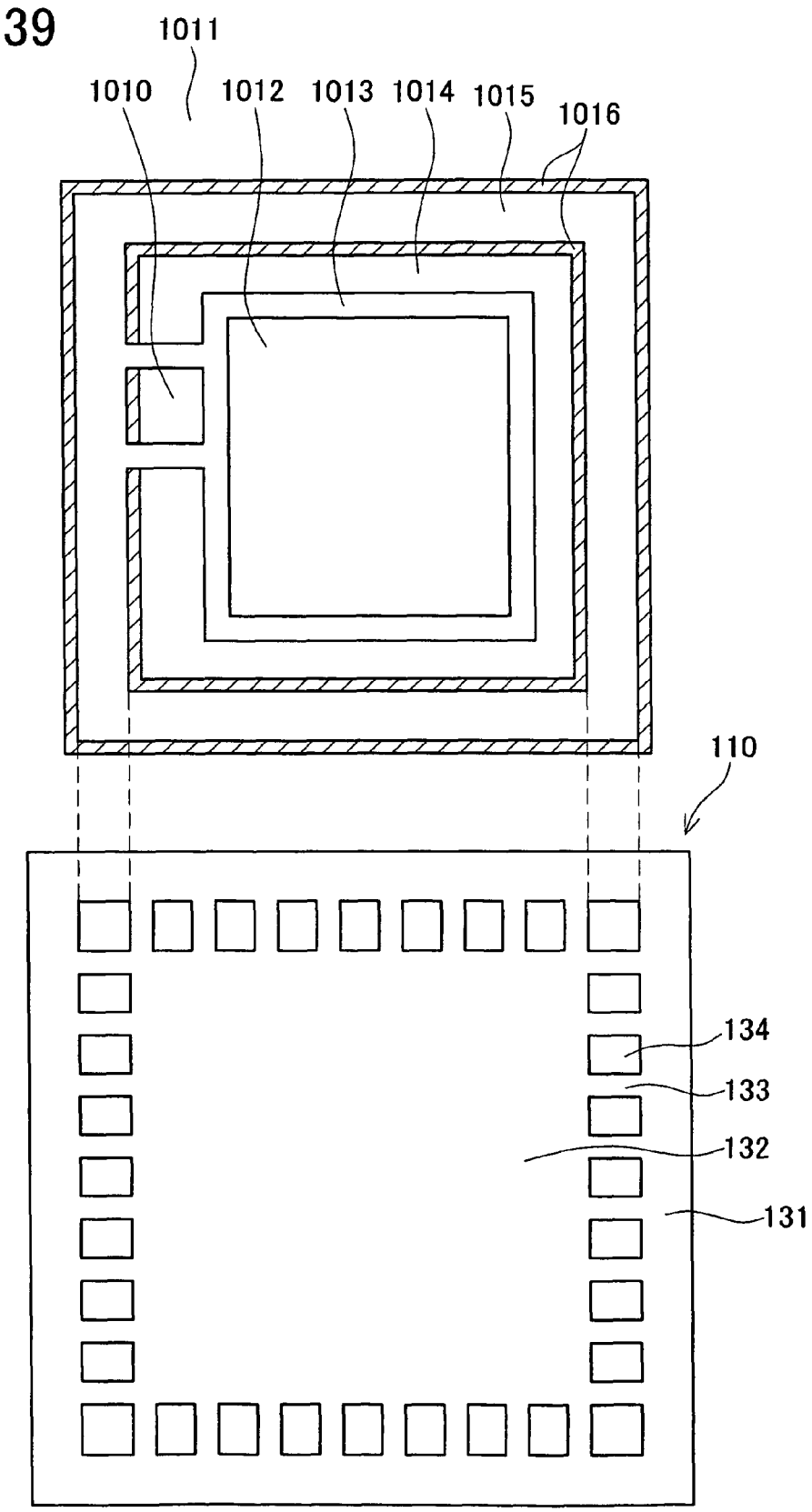
FIG. 39 shows an enlarged plan view of essential parts of the stencil mask.

An enlarged plan view of essential parts of a stencil mask 110 utilized when the separating ion distributing regions 1016 are to be formed is shown at the lower side of the page of FIG. 39. FIG. 39 shows how the pattern of penetrating holes 134 of the stencil mask 110 corresponds with the level shift circuit 1000 shown at the upper side of the page of FIG. 39. In the present embodiment, as will be described below, ionized atoms are introduced into the semiconductor upper layer 1026 utilizing the oblique ion injection method. As a result, the penetrating holes 134 formed in the stencil mask 110 are formed along the insulating and separating outer trench 1015, and are formed in a location corresponding to the separating ion distributing regions 1016 located at side walls of the insulating and separating outer trench 1015.

Next, the method of manufacturing the LDMOS will be described with reference to FIGS. 40~44.

Figure 40:
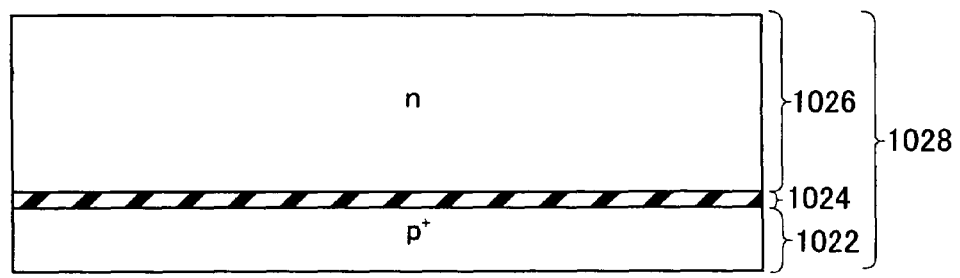
FIG. 40 shows a process of manufacturing the LDMOS (1).

First, the SOI substrate 1028 shown in FIG. 40 is prepared. The SOI substrate 1028 is formed by first forming the embedded insulating layer 1024 by thermally oxidizing a surface of the semiconductor lower layer 1022 (silicon wafer) that contains boron, then laminating the semiconductor upper layer 1026 (silicon wafer) that contains phosphorus.

Figure 41:
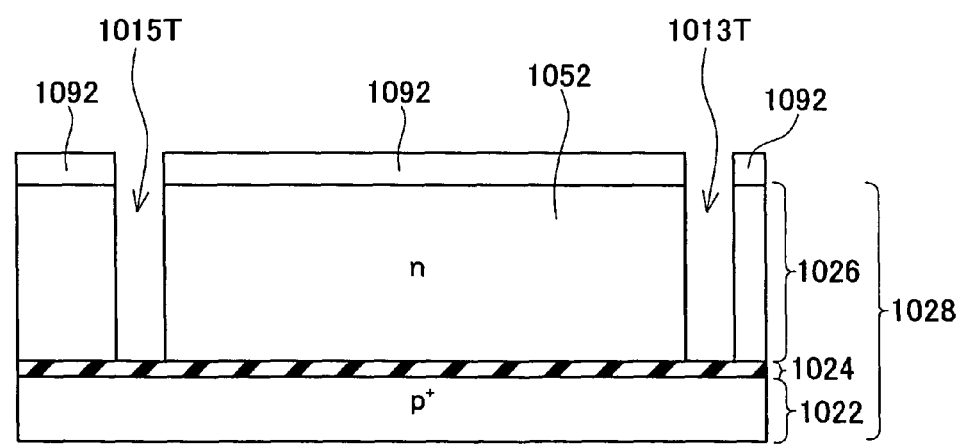
FIG. 41 shows a process of manufacturing the LDMOS (2).

Next, as shown in FIG. 41, a mask film 1092 that consists of an HTO (High Temperature Oxide) film is formed on the semiconductor layer 1026.

Next, the mask film 1092 is patterned utilizing the lithography method. At this juncture, the mask film 1092 is removed at positions that correspond to the parts where the insulating and separating trenches 1013 and 1015 are formed. Then, anisotropic etching is utilized to form trenches 1013T and 1015T that extend to the embedded insulating layer 1024 from penetrating holes used for etching trenches of the mask film 1092.

Figure 42:
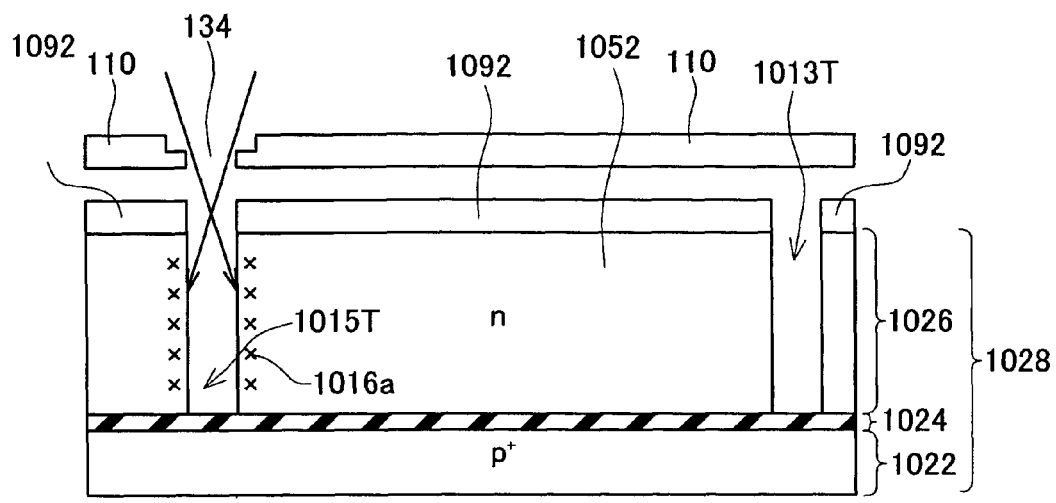
FIG. 42 shows a process of manufacturing the LDMOS (3).

Next, as shown in FIG. 42, the stencil mask 110 is disposed above the SOI substrate 1028, and oblique ion injection is performed toward a surface of the SOI substrate 1028. The solid arrows in the figure show the directions in which the ionize atoms are injected. The ionized atoms that have passed through the penetrating holes 134 of the stencil mask 110 are introduced selectively only at side walls of the trench 1015T. Since the stencil mask 110 covers the above of the trench 1013T, the ionized atoms are not introduced into the trench 1013T. Ion introducing areas 1016a can be formed only at the side walls that demarcate the trench 1015T.

Figure 43:
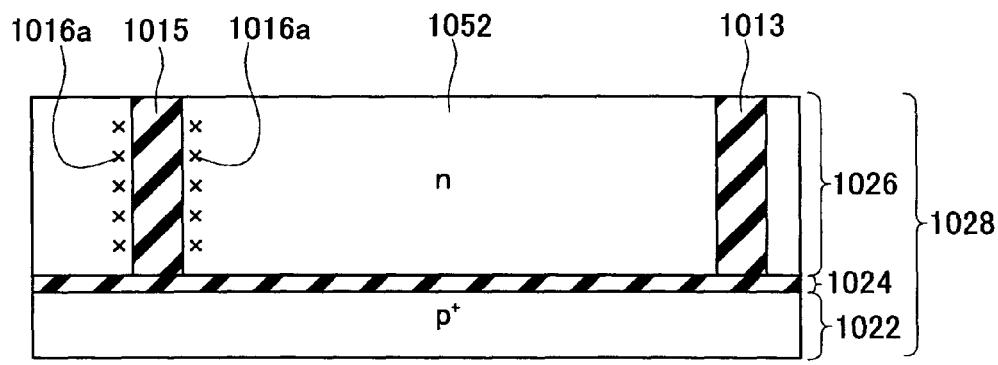
FIG. 43 shows a process of manufacturing the LDMOS (4).

Next, as shown in FIG. 43, the mask film 1092 is removed by wet etching. After the mask film 1092 has been removed, the trenches 1013T and 1015T are filled with a TEOS (Tetra Ethyl Ortho Silicate) film utilizing, for example, the vacuum CVD method.

Figure 44:
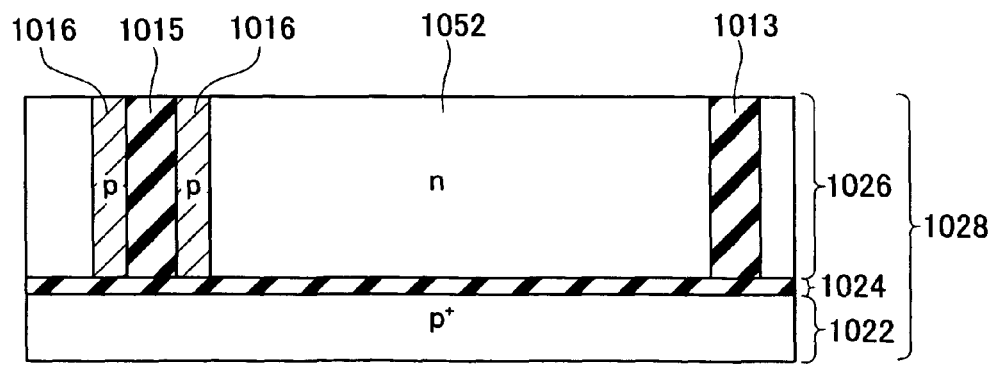
FIG. 44 shows a process of manufacturing the LDMOS (5).

Then, as shown in FIG. 44, thermal processing is performed, whereupon impurities introduced into the ion introducing areas 1016a are activated, and the separating ion distributing regions 1016 are formed. Furthermore, the thermal process for forming the ion introducing areas 1016a is not restricted to being formed at the aforementioned step, but can be performed at any appropriate point in the process.

Next, a known manufacturing technique such as the ion introducing method, the thermal oxidizing method, or the like, is utilized to form a distributing area, an oxide film, electrode wiring, etc. on the surface side, thus allowing the LMDOS shown in FIG. 38 to be obtained.

Specific examples of embodiments of the present invention have been described in detail above, but these merely illustrate some possibilities of the invention and do not restrict the claims thereof. The art set forth in the claims includes various transformations and modifications to the specific examples set forth above.

In the above embodiments, examples were given in which a semiconductor stack was utilized wherein a first semiconductor layer and a second semiconductor layer were stacked in a stencil mask. Instead of this example, the stencil mask of the present invention may utilize a single semiconductor layer. In the case where this type of stencil mask is manufactured, first penetrating holes are first formed from one face, and the depth of the first penetrating holes is controlled using time or the like so as to prevent their passing through the semiconductor layer. Then a plurality of second penetrating holes are formed on the other face, these second penetrating holes passing through to the first penetrating holes. The second penetrating holes are formed in a distributed manner, and remaining parts thereof form beam members. If this type of manufacturing method is used, the stencil mask of the present invention can be obtained even with a single semiconductor layer.

Furthermore, the technical elements disclosed in the present specification or figures may be utilized separately or in all types of conjunctions and are not limited to the conjunctions set forth in the claims at the time of submission of the application. Furthermore, the art disclosed in the present specification or figures may be utilized to simultaneously realize a plurality of aims or to realize one of these aims.

What is claimed is:

1. A stencil mask for limiting an irradiation area of charged particles on a surface of a substrate to a predetermined closed loop shape, the stencil mask comprising:
   a first layer disposed at a side of the stencil mask which faces toward the substrate; and
   a second layer disposed at a side of the stencil mask to which the charged particles are irradiated, wherein:
      at least one first penetrating hole having the predetermined closed loop shape is formed in the first layer;
      a plurality of second penetrating holes is formed in the second layer within a distributing area encompassing the predetermined closed loop shape, the plurality of the second penetrating holes being distributed within the distributing area; and
      a portion of the second layer separating at least one pair of adjacent second penetrating holes crosses a limited portion of the first penetrating hole when viewed along the traveling path of the charged particles.

2. The stencil mask according to claim 1,
wherein the distributing area of the second penetrating holes is larger than the shape of the first penetrating hole when viewed along the traveling path of the charged particles.

3. The stencil mask according to claim 1,
wherein the first layer and the second layer are made of semiconductor material, and the first layer and the second layer are in contact with each other.

4. The stencil mask according to claim 1,
wherein the portion of the second layer separating at least one pair of adjacent second penetrating holes connects portions of the first layer separated by the first penetrating hole.

5. The stencil mask according to claim 1,
wherein each of the second penetrating holes has a convex polygonal shape.

6. The stencil mask according to claim 1,
wherein a distance between at least one pair of adjacent second penetrating holes is longer at the side of the second layer to which the charged particles are irradiated than at the side of the second layer facing toward the first layer.

7. A device for irradiating charged particles, comprising:
a charged particle generator;
a mass analyzer for selecting predetermined charged particles from the charged particles generated by the generator;
an accelerator for accelerating the selected charged particles;
an irradiating chamber for accepting a substrate, and
the stencil mask according to claim 1 disposed between the accelerator and the substrate being accepted within the irradiating chamber.

8. A method of using a stencil mask, comprising:
disposing the stencil mask of claim 1 above a substrate; and
irradiating charged particles through the stencil mask to the surface of the substrate.

9. A method of manufacturing a semiconductor device, comprising:
disposing the stencil mask of claim 1 above a semiconductor wafer; and
irradiating charged particles through the stencil mask to the surface of the semiconductor wafer.

10. A stencil mask for limiting an irradiation area of charged particles on a surface of a substrate to a predetermined closed loop shape with an island portion located within the closed loop, the stencil mask comprising:
   a first layer disposed at a side of the stencil mask which faces toward the substrate; and
   a second layer disposed at a side of the stencil mask to which the charged particles are irradiated, wherein:
      at least one first penetrating hole having the predetermined closed loop shape with the island portion located within the closed loop is formed in the first layer; and
      at least a portion of the second layer crosses a limited portion of the first penetrating hole and connects the island portion and a portion of the first layer surrounding the first penetrating hole when viewed along the traveling path of the charged particles.

* * * * *